(12) United States Patent
Lloyd et al.

(10) Patent No.: US 11,151,300 B2
(45) Date of Patent: Oct. 19, 2021

(54) INTEGRATED ROUTING ASSEMBLY AND SYSTEM USING SAME

(71) Applicant: Molex, LLC, Lisle, IL (US)

(72) Inventors: Brian Keith Lloyd, Maumelle, AR (US); Gregory Walz, Maumelle, AR (US); Ayman Isaac, Little Rock, AR (US); Kent E. Regnier, Lombard, IL (US); Bruce Reed, Maumelle, AR (US)

(73) Assignee: Molex, LLC, Lisle, IL (US)

( * ) Notice: Subject to any disclaimer, the term of this patent is extended or adjusted under 35 U.S.C. 154(b) by 712 days.

(21) Appl. No.: 16/070,636

(22) PCT Filed: Jan. 19, 2017

(86) PCT No.: PCT/US2017/014089
§ 371 (c)(1),
(2) Date: Jul. 17, 2018

(87) PCT Pub. No.: WO2017/127513
PCT Pub. Date: Jul. 27, 2017

(65) Prior Publication Data
US 2021/0209285 A1 Jul. 8, 2021

Related U.S. Application Data

(60) Provisional application No. 62/280,411, filed on Jan. 19, 2016.

(51) Int. Cl.
*G06F 30/30* (2020.01)
*G06F 30/398* (2020.01)
(Continued)

(52) U.S. Cl.
CPC .......... *G06F 30/398* (2020.01); *G06F 30/331* (2020.01); *G06F 30/367* (2020.01); *G06F 30/373* (2020.01)

(58) Field of Classification Search
CPC .... G06F 30/398; G06F 30/373; G06F 30/367; G06F 30/331
(Continued)

(56) References Cited

U.S. PATENT DOCUMENTS 3,007,131 A 10/1961 Dahlgren et al.
3,594,613 A 7/1971 Prietula
(Continued)

FOREIGN PATENT DOCUMENTS

CN 2379933 Y 5/2000
CN 2415473 Y 1/2001
(Continued)

OTHER PUBLICATIONS

U.S. Appl. No. 61/714,871, filed Oct. 17, 2012, Wig et al.
(Continued)

*Primary Examiner* — Jack Chiang
*Assistant Examiner* — Brandon Bowers

(57) ABSTRACT

A routing assembly for an electronic device has a plurality of connectors ports and each of the connector ports contains a first connector connected to one or more cables. Cables are directly terminated, at first ends thereof, to terminals of the first connectors and the cables can be embedded in a routing substrate. The routing substrate has an opening which accommodates a chip package. Second ends of the cables are terminated to second connectors arranged in the package opening and the second connectors are in turn connected to third connectors that are connected to the chip package.

12 Claims, 22 Drawing Sheets

(51) Int. Cl.
*G06F 30/373* (2020.01)
*G06F 30/367* (2020.01)
*G06F 30/331* (2020.01)

(58) Field of Classification Search
USPC ........................................................ 716/111
See application file for complete search history.

(56) References Cited

U.S. PATENT DOCUMENTS

| | | |
|---|---|---|
| 3,633,152 A | 1/1972 | Podmore |
| 3,963,319 A | 6/1976 | Schumacher et al. |
| 4,009,921 A | 3/1977 | Narozny |
| 4,025,141 A | 5/1977 | Thelissen |
| 4,060,295 A | 11/1977 | Tomkiewicz |
| 4,072,387 A | 2/1978 | Sochor |
| 4,083,615 A | 4/1978 | Volinskie |
| 4,157,612 A | 6/1979 | Rainal |
| 4,290,664 A | 9/1981 | Davis et al. |
| 4,307,926 A | 12/1981 | Smith |
| 4,346,355 A | 8/1982 | Tsukii |
| 4,417,779 A | 11/1983 | Wilson |
| 4,508,403 A | 4/1985 | Weltman |
| 4,611,186 A | 9/1986 | Ziegner |
| 4,615,578 A | 10/1986 | Stadler |
| 4,639,054 A | 1/1987 | Kersbergen |
| 4,656,441 A | 4/1987 | Takahashi et al. |
| 4,657,329 A | 4/1987 | Dechelette |
| 4,679,321 A | 7/1987 | Plonski |
| 4,697,862 A | 10/1987 | Hasircoglu |
| 4,724,409 A | 2/1988 | Lehman |
| 4,889,500 A | 12/1989 | Lazar |
| 4,924,179 A | 5/1990 | Sherman |
| 4,948,379 A | 8/1990 | Evans |
| 4,984,992 A | 1/1991 | Beamenderfer et al. |
| 4,991,001 A | 2/1991 | Takubo et al. |
| 5,112,251 A | 5/1992 | Cesar |
| 5,197,893 A | 3/1993 | Morlion et al. |
| 5,332,979 A | 7/1994 | Roskewitsch |
| 5,387,130 A | 2/1995 | Fedder et al. |
| 5,402,088 A | 3/1995 | Pierro et al. |
| 5,435,757 A | 7/1995 | Fedder et al. |
| 5,441,424 A | 8/1995 | Morlion et al. |
| 5,479,110 A | 12/1995 | Crane et al. |
| 5,487,673 A | 1/1996 | Hurtarte |
| 5,509,827 A | 4/1996 | Huppenthal et al. |
| 5,554,038 A | 9/1996 | Morlion et al. |
| 5,598,627 A | 2/1997 | Saka et al. |
| 5,632,634 A | 5/1997 | Soes |
| 5,691,506 A | 11/1997 | Miyazaki et al. |
| 5,781,759 A | 7/1998 | Kashiwabara |
| 5,784,644 A | 7/1998 | Larabell |
| 5,813,243 A | 9/1998 | Johnson et al. |
| 5,842,873 A | 12/1998 | Gonzales |
| 5,876,239 A | 3/1999 | Morin et al. |
| 6,004,139 A | 12/1999 | Dramstad et al. |
| 6,053,770 A | 4/2000 | Blom |
| 6,067,226 A | 5/2000 | Barker et al. |
| 6,083,046 A | 7/2000 | Wu et al. |
| 6,095,872 A | 8/2000 | Lang et al. |
| 6,098,127 A | 8/2000 | Kwang |
| 6,139,372 A | 10/2000 | Yang |
| 6,144,559 A | 11/2000 | Johnson et al. |
| 6,156,981 A | 12/2000 | Ward et al. |
| 6,195,263 B1 | 2/2001 | Aoike |
| 6,203,376 B1 | 3/2001 | Magajne et al. |
| 6,216,184 B1 | 4/2001 | Fackenthall et al. |
| 6,238,219 B1 | 5/2001 | Wu |
| 6,255,741 B1 | 7/2001 | Yoshihara |
| 6,266,712 B1 | 7/2001 | Henrichs |
| 6,273,753 B1 | 8/2001 | Ko |
| 6,273,758 B1 | 8/2001 | Lloyd et al. |
| 6,366,471 B1 | 4/2002 | Edwards et al. |
| 6,368,120 B1 | 4/2002 | Scherer |
| 6,371,788 B1 | 4/2002 | Bowling et al. |
| 6,452,789 B1 | 9/2002 | Pallotti et al. |
| 6,454,605 B1 | 9/2002 | Bassler et al. |
| 6,489,563 B1 | 12/2002 | Zhao et al. |
| 6,535,367 B1 | 3/2003 | Carpenter |
| 6,538,903 B1 | 3/2003 | Radu et al. |
| 6,574,115 B2 | 6/2003 | Asano et al. |
| 6,575,772 B1 | 6/2003 | Soubh et al. |
| 6,592,401 B1 | 7/2003 | Gardner et al. |
| 6,652,296 B2 | 11/2003 | Kuroda et al. |
| 6,652,318 B1 | 11/2003 | Winings et al. |
| 6,667,891 B2 | 12/2003 | Coglitore et al. |
| 6,685,501 B1 | 2/2004 | Wu et al. |
| 6,692,262 B1 | 2/2004 | Loveless |
| 6,705,893 B1 | 3/2004 | Ko |
| 6,764,342 B2 | 7/2004 | Murayama et al. |
| 6,780,069 B2 | 8/2004 | Scherer |
| 6,797,891 B1 | 9/2004 | Blair et al. |
| 6,812,560 B2 | 11/2004 | Recktenwald et al. |
| 6,824,426 B1 | 11/2004 | Spink, Jr. |
| 6,843,657 B2 | 1/2005 | Driscoll et al. |
| 6,859,854 B2 | 2/2005 | Kwong |
| 6,878,012 B2 | 4/2005 | Gutierrez et al. |
| 6,882,241 B2 | 4/2005 | Abo et al. |
| 6,903,934 B2 | 6/2005 | Lo |
| 6,910,914 B1 | 6/2005 | Spink, Jr. |
| 6,916,183 B2 | 7/2005 | Alger et al. |
| 6,955,565 B2 | 10/2005 | Lloyd |
| 6,969,270 B2 | 11/2005 | Renfro |
| 6,969,280 B2 | 11/2005 | Chien |
| 6,971,887 B1 | 12/2005 | Trobough |
| 7,004,765 B2 | 2/2006 | Hsu |
| 7,004,767 B2 | 2/2006 | Kim |
| 7,004,793 B2 | 2/2006 | Scherer |
| 7,008,234 B1 | 3/2006 | Brown |
| 7,040,918 B2 | 5/2006 | Moriyama et al. |
| 7,044,772 B2 | 5/2006 | McCreery |
| 7,052,292 B2 | 5/2006 | Hsu et al. |
| 7,056,128 B2 | 6/2006 | Driscoll et al. |
| 7,066,756 B2 | 6/2006 | Lange et al. |
| 7,070,446 B2 | 7/2006 | Henry |
| 7,086,888 B2 | 8/2006 | Wu |
| 7,108,522 B2 | 9/2006 | Verelst et al. |
| 7,148,428 B2 | 12/2006 | Meier et al. |
| 7,163,421 B1 | 1/2007 | Cohen et al. |
| 7,168,961 B2 | 1/2007 | Hsieh |
| 7,175,446 B2 | 2/2007 | Bright |
| 7,192,300 B2 | 3/2007 | Hashiguchi et al. |
| 7,214,097 B1 | 5/2007 | Hsu et al. |
| 7,223,915 B2 | 5/2007 | Hackman |
| 7,234,944 B2 | 6/2007 | Nordin |
| 7,244,137 B2 | 7/2007 | Renfro et al. |
| 7,280,372 B2 | 10/2007 | Grundy et al. |
| 7,307,293 B2 | 12/2007 | Fjelstad et al. |
| 7,331,816 B2 | 2/2008 | Krohn et al. |
| 7,384,275 B2 | 6/2008 | Ngo |
| 7,394,665 B2 | 7/2008 | Hamasaki et al. |
| 7,402,048 B2 | 7/2008 | Meier et al. |
| 7,431,608 B2 | 10/2008 | Sakaguchi et al. |
| 7,445,471 B1 | 11/2008 | Scherer et al. |
| 7,462,924 B2 | 12/2008 | Shuey |
| 7,489,514 B2 | 2/2009 | Hamasaki et al. |
| 7,534,142 B2 | 5/2009 | Avery |
| 7,535,090 B2 | 5/2009 | Furuyama et al. |
| 7,540,773 B2 | 6/2009 | Ko |
| 7,549,897 B2 | 6/2009 | Fedder et al. |
| 7,621,779 B2 | 11/2009 | Laurx et al. |
| 7,637,767 B2 | 12/2009 | Davis |
| 7,654,831 B1 | 2/2010 | Wu |
| 7,658,654 B2 | 2/2010 | Ohyama |
| 7,667,982 B2 | 2/2010 | Hamasaki et al. |
| 7,690,930 B2 | 4/2010 | Chen et al. |
| 7,719,843 B2 | 5/2010 | Dunham |
| 7,737,360 B2 | 6/2010 | Wiemeyer et al. |
| 7,744,385 B2 | 6/2010 | Scherer |
| 7,744,403 B2 | 6/2010 | Barr |
| 7,744,414 B2 | 6/2010 | Scherer et al. |
| 7,748,988 B2 | 7/2010 | Hori |
| 7,771,207 B2 | 8/2010 | Hamner et al. |
| 7,789,529 B2 | 9/2010 | Roberts |
| 7,813,146 B1 | 10/2010 | Phan |

(56) References Cited

U.S. PATENT DOCUMENTS

| | | |
|---|---|---|
| 7,819,675 B2 | 10/2010 | Ko et al. |
| 7,824,197 B1 | 11/2010 | Westman |
| 7,857,629 B2 | 12/2010 | Chin |
| 7,857,630 B2 | 12/2010 | Hermant et al. |
| 7,862,344 B2 | 1/2011 | Morgan |
| 7,892,019 B2 | 2/2011 | Rao |
| 7,904,763 B2 | 3/2011 | Araki et al. |
| 7,906,730 B2 | 3/2011 | Atkinson et al. |
| 7,931,502 B2 | 4/2011 | Iida |
| 7,985,097 B2 | 7/2011 | Gulla |
| 7,997,933 B2 | 8/2011 | Feldman |
| 8,002,583 B2 | 8/2011 | van Woensel |
| 8,018,733 B2 | 9/2011 | Jia |
| 8,035,973 B2 | 10/2011 | Mcculloch |
| 8,036,500 B2 | 10/2011 | McColloch |
| 8,089,779 B2 | 1/2012 | Fietz et al. |
| 8,096,813 B2 | 1/2012 | Biggs |
| 8,157,573 B2 | 4/2012 | Tanaka |
| 8,162,675 B2 | 4/2012 | Regnier |
| 8,187,038 B2 | 5/2012 | Kamiya |
| 8,188,594 B2 | 5/2012 | Ganesan et al. |
| 8,192,222 B2 | 6/2012 | Kameyama |
| 8,226,441 B2 | 7/2012 | Regnier |
| 8,308,491 B2 | 11/2012 | Nichols et al. |
| 8,337,243 B2 | 12/2012 | Elkhatib et al. |
| 8,338,713 B2 | 12/2012 | Fjelstad et al. |
| 8,374,470 B2 | 2/2013 | Ban et al. |
| 8,398,433 B1 | 3/2013 | Yang |
| 8,419,472 B1 | 4/2013 | Swanger |
| 8,435,074 B1 | 5/2013 | Grant |
| 8,439,704 B2 | 5/2013 | Reed |
| 8,449,312 B2 | 5/2013 | Lan |
| 8,449,330 B1 | 5/2013 | Schroll |
| 8,465,302 B2 | 6/2013 | Regnier |
| 8,480,413 B2 | 7/2013 | Minich |
| 8,517,765 B2 | 8/2013 | Schroll |
| 8,535,069 B2 | 9/2013 | ZHang |
| 8,540,525 B2 | 9/2013 | Regnier |
| 8,575,529 B2 | 9/2013 | Asahi |
| 8,553,102 B2 | 10/2013 | Yamada |
| 8,575,491 B2 | 11/2013 | Gundel et al. |
| 8,585,442 B2 | 11/2013 | Tuma et al. |
| 8,588,561 B2 | 11/2013 | Zbinden |
| 8,597,055 B2 | 12/2013 | Regnier |
| 8,651,890 B2 | 2/2014 | Chiarelli |
| 8,672,707 B2 | 3/2014 | Nichols et al. |
| 8,687,350 B2 | 4/2014 | Santos |
| 8,690,604 B2 | 4/2014 | Davis |
| 8,715,003 B2 | 5/2014 | Buck |
| 8,721,361 B2 | 5/2014 | Wu |
| 8,740,644 B2 | 6/2014 | Long |
| 8,747,158 B2 | 6/2014 | Szczesny |
| 8,753,145 B2 | 6/2014 | Lang |
| 8,758,051 B2 | 6/2014 | Nonen et al. |
| 8,764,483 B2 | 7/2014 | Ellison |
| 8,784,122 B2 | 7/2014 | Soubh |
| 8,787,711 B2 | 7/2014 | Zbinden |
| 8,794,991 B2 | 8/2014 | Ngo |
| 8,804,342 B2 | 8/2014 | Behziz et al. |
| 8,814,595 B2 | 8/2014 | Cohen et al. |
| 8,834,190 B2 | 9/2014 | Ngo |
| 8,864,521 B2 | 10/2014 | Atkinson et al. |
| 8,888,533 B2 | 11/2014 | Westman et al. |
| 8,905,767 B2 | 12/2014 | Putt, Jr. et al. |
| 8,911,255 B2 | 12/2014 | Scherer et al. |
| 8,926,342 B2 | 1/2015 | Vinther |
| 8,926,377 B2 | 1/2015 | Kirk |
| 8,992,236 B2 | 3/2015 | Wittig |
| 8,992,237 B2 | 3/2015 | Regnier |
| 8,992,258 B2 | 3/2015 | Raschilla |
| 9,011,177 B2 | 4/2015 | Lloyd |
| 9,028,281 B2 | 5/2015 | Kirk |
| 9,035,183 B2 | 5/2015 | Kodama et al. |
| 9,040,824 B2 | 5/2015 | Guetig et al. |
| 9,054,432 B2 | 6/2015 | Yang |
| 9,071,001 B2 | 6/2015 | Scherer et al. |
| 9,118,151 B2 | 8/2015 | Tran et al. |
| 9,119,292 B2 | 8/2015 | Gundel |
| 9,136,652 B2 | 9/2015 | Ngo |
| 9,142,921 B2 | 9/2015 | Wanha et al. |
| 9,155,214 B2 | 10/2015 | Ritter |
| 9,160,123 B1 | 10/2015 | Pao |
| 9,160,151 B2 | 10/2015 | Vinther |
| 9,161,463 B2 | 10/2015 | Takamura |
| 9,166,320 B1 | 10/2015 | Herring |
| 9,196,983 B2 | 11/2015 | Saur et al. |
| 9,203,171 B2 | 12/2015 | Yu |
| 9,209,539 B2 | 12/2015 | Herring |
| 9,214,756 B2 | 12/2015 | Nishio |
| 9,214,768 B2 | 12/2015 | Pao |
| 9,232,676 B2 | 1/2016 | Sechrist et al. |
| 9,246,251 B2 | 1/2016 | Regnier |
| 9,277,649 B2 | 3/2016 | Ellison |
| 9,292,055 B2 | 3/2016 | Wu |
| 9,312,618 B2 | 4/2016 | Regnier |
| 9,331,432 B1 | 5/2016 | Phillips |
| 9,350,108 B2 | 5/2016 | Long |
| 9,356,366 B2 | 5/2016 | Moore |
| 9,385,455 B2 | 7/2016 | Regnier |
| 9,391,407 B1 | 7/2016 | Bucher |
| 9,401,563 B2 | 7/2016 | Simpson |
| 9,413,090 B2 | 8/2016 | Nagamine |
| 9,413,097 B2 | 8/2016 | Tamarkin et al. |
| 9,413,112 B2 | 8/2016 | Helster |
| 9,431,773 B2 | 8/2016 | Chen |
| 9,437,981 B2 | 9/2016 | Wu |
| 9,455,538 B2 | 9/2016 | Nishio |
| 9,484,671 B2 | 11/2016 | Zhu |
| 9,484,673 B1 | 11/2016 | Yang |
| 9,490,587 B1 | 11/2016 | Phillips |
| 9,496,655 B1 | 11/2016 | Huang |
| 9,515,429 B2 | 12/2016 | DeGeest |
| 9,525,245 B2 | 12/2016 | Regnier |
| 9,543,688 B2 | 1/2017 | Pao |
| 9,553,381 B2 | 1/2017 | Regnier |
| 9,559,465 B2 | 1/2017 | Phillips |
| 9,565,780 B2 | 2/2017 | Nishio |
| 9,608,388 B2 | 3/2017 | Kondo |
| 9,608,590 B2 | 3/2017 | Hamner |
| 9,627,818 B1 | 4/2017 | Chen |
| 9,660,364 B2 | 5/2017 | Wig et al. |
| 9,666,998 B1 | 5/2017 | deBoer |
| 9,673,570 B2 | 6/2017 | Briant |
| 9,705,258 B2 | 7/2017 | Phillips et al. |
| 9,812,799 B2 | 11/2017 | Wittig |
| 9,846,287 B2 | 12/2017 | Mack |
| 9,985,367 B2 | 5/2018 | Wanha et al. |
| 10,424,856 B2 | 9/2019 | Lloyd et al. |
| 2001/0016438 A1 | 8/2001 | Reed |
| 2001/0042913 A1 | 11/2001 | Fukuda et al. |
| 2002/0111067 A1 | 8/2002 | Sakurai et al. |
| 2002/0157865 A1 | 10/2002 | Noda |
| 2002/0180554 A1 | 12/2002 | Clark et al. |
| 2003/0064616 A1 | 4/2003 | Reed et al. |
| 2003/0073331 A1 | 4/2003 | Peloza et al. |
| 2003/0180006 A1 | 9/2003 | Loh et al. |
| 2003/0222282 A1 | 12/2003 | Fjelstad et al. |
| 2004/0094328 A1 | 5/2004 | Fjelstad et al. |
| 2004/0121633 A1 | 6/2004 | David et al. |
| 2004/0155328 A1 | 8/2004 | Kline |
| 2004/0155734 A1 | 8/2004 | Kosemura et al. |
| 2004/0229510 A1 | 11/2004 | Lloyd |
| 2004/0264894 A1 | 12/2004 | Cooke |
| 2005/0006126 A1 | 1/2005 | Aisenbrey |
| 2005/0051810 A1 | 3/2005 | Funakura |
| 2005/0093127 A1 | 5/2005 | Fjelstad et al. |
| 2005/0130490 A1 | 6/2005 | Rose |
| 2005/0142944 A1 | 6/2005 | Ling et al. |
| 2005/0239339 A1 | 10/2005 | Pepe |
| 2006/0001163 A1 | 1/2006 | Kolbehdari et al. |
| 2006/0035523 A1 | 2/2006 | Kuroda et al. |
| 2006/0038287 A1 | 2/2006 | Hamasaki et al. |
| 2006/0050493 A1 | 3/2006 | Hamasaki et al. |
| 2006/0079102 A1 | 4/2006 | DeLessert |

(56) References Cited

U.S. PATENT DOCUMENTS

| | | |
|---|---|---|
| 2006/0079119 A1 | 4/2006 | Wu |
| 2006/0088254 A1 | 4/2006 | Mohammed |
| 2006/0091507 A1 | 5/2006 | Fjelstad et al. |
| 2006/0114016 A1 | 6/2006 | Suzuki |
| 2006/0160399 A1 | 7/2006 | Dawiedczyk et al. |
| 2006/0189212 A1 | 8/2006 | Avery |
| 2006/0194475 A1 | 8/2006 | Miyazaki |
| 2006/0216969 A1 | 9/2006 | Bright |
| 2006/0228922 A1 | 10/2006 | Morriss |
| 2006/0234556 A1 | 10/2006 | Wu |
| 2006/0238991 A1 | 10/2006 | Drako |
| 2006/0282724 A1 | 12/2006 | Roulo |
| 2006/0292898 A1 | 12/2006 | Meredith |
| 2007/0032104 A1 | 2/2007 | Yamada |
| 2007/0141871 A1 | 6/2007 | Scherer |
| 2007/0243741 A1 | 10/2007 | Yang |
| 2008/0024999 A1 | 1/2008 | Huang |
| 2008/0131997 A1 | 6/2008 | Kim et al. |
| 2008/0171476 A1 | 7/2008 | Liu |
| 2008/0186666 A1 | 8/2008 | Wu |
| 2008/0242127 A1 | 10/2008 | Murr et al. |
| 2008/0297988 A1 | 12/2008 | Chau |
| 2008/0305689 A1 | 12/2008 | Zhang et al. |
| 2009/0023330 A1 | 1/2009 | Stoner et al. |
| 2009/0153169 A1 | 6/2009 | Soubh et al. |
| 2009/0166082 A1 | 7/2009 | Liu et al. |
| 2009/0174991 A1 | 7/2009 | Mahdavi |
| 2009/0215309 A1 | 8/2009 | Mongold et al. |
| 2010/0042770 A1 | 2/2010 | Chuang |
| 2010/0068944 A1 | 3/2010 | Scherer |
| 2010/0112850 A1 | 5/2010 | Rao |
| 2010/0159829 A1 | 6/2010 | McCormack |
| 2010/0177489 A1 | 7/2010 | Yagisawa |
| 2010/0190373 A1 | 7/2010 | Yeh |
| 2010/0203768 A1 | 8/2010 | Kondo |
| 2011/0043371 A1 | 2/2011 | German et al. |
| 2011/0074213 A1 | 3/2011 | Schaffer |
| 2011/0080719 A1 | 4/2011 | Jia |
| 2011/0136387 A1 | 6/2011 | Matsuura |
| 2011/0177699 A1 | 7/2011 | Crofoot et al. |
| 2011/0212633 A1 | 9/2011 | Regnier |
| 2011/0230104 A1 | 9/2011 | Lang |
| 2011/0263156 A1 | 10/2011 | Ko |
| 2011/0300757 A1 | 12/2011 | Regnier |
| 2011/0304966 A1 | 12/2011 | Schrempp |
| 2012/0003848 A1 | 1/2012 | Casher et al. |
| 2012/0033370 A1 | 2/2012 | Reinke et al. |
| 2012/0034820 A1 | 2/2012 | Lang |
| 2012/0225585 A1 | 9/2012 | Lee |
| 2012/0243837 A1 | 9/2012 | Ko et al. |
| 2012/0246373 A1 | 9/2012 | Chang |
| 2012/0251116 A1 | 10/2012 | Li et al. |
| 2013/0005178 A1 | 1/2013 | Straka et al. |
| 2013/0012038 A1 | 1/2013 | Kirk |
| 2013/0017715 A1 | 1/2013 | Van Laarhoven |
| 2013/0040482 A1 | 2/2013 | Ngo |
| 2013/0092429 A1 | 4/2013 | Ellison |
| 2013/0148321 A1 | 6/2013 | Liang |
| 2013/0340251 A1 | 12/2013 | Regnier |
| 2014/0041937 A1 | 2/2014 | Lloyd |
| 2014/0073173 A1 | 3/2014 | Yang |
| 2014/0073174 A1 | 3/2014 | Yang |
| 2014/0073181 A1 | 3/2014 | Yang |
| 2014/0111293 A1 | 4/2014 | Madeberg et al. |
| 2014/0141643 A1 | 5/2014 | Panella et al. |
| 2014/0148048 A1 | 5/2014 | Shinohara |
| 2014/0217571 A1 | 8/2014 | Ganesan et al. |
| 2014/0242844 A1 | 8/2014 | Wanha |
| 2014/0273551 A1 | 9/2014 | Resendez |
| 2014/0273594 A1 | 9/2014 | Jones et al. |
| 2014/0335736 A1 | 11/2014 | Regnier |
| 2015/0013936 A1 | 1/2015 | Mack |
| 2015/0079845 A1 | 3/2015 | Wanha |
| 2015/0090491 A1 | 4/2015 | Dunwoody |
| 2015/0180578 A1 | 6/2015 | Leigh et al. |
| 2015/0207247 A1 | 7/2015 | Regnier et al. |
| 2015/0212961 A1 | 7/2015 | Wu |
| 2016/0013596 A1 | 1/2016 | Regnier |
| 2016/0064119 A1 | 3/2016 | Grant |
| 2016/0104956 A1 | 4/2016 | Santos |
| 2016/0181713 A1 | 6/2016 | Peloza |
| 2016/0190720 A1 | 6/2016 | Lindkamp |
| 2016/0190747 A1 | 6/2016 | Regnier |
| 2016/0197423 A1 | 7/2016 | Regnier |
| 2016/0218455 A1 | 7/2016 | Sayre |
| 2016/0233598 A1 | 8/2016 | Wittig |
| 2016/0233615 A1 | 8/2016 | Scholeno |
| 2016/0336692 A1 | 11/2016 | Champion et al. |
| 2016/0380383 A1 | 12/2016 | Lord |
| 2017/0033482 A1 | 2/2017 | Liao |
| 2017/0033509 A1 | 2/2017 | Liao |
| 2017/0077621 A1 | 3/2017 | Liao |
| 2017/0098901 A1 | 4/2017 | Regnier |
| 2017/0110222 A1 | 4/2017 | Liptak et al. |
| 2017/0162960 A1 | 6/2017 | Wanha |
| 2017/0302036 A1 | 10/2017 | Regnier |
| 2017/0365942 A1 | 10/2017 | Regnier |
| 2018/0034175 A1 | 2/2018 | Lloyd |
| 2019/0027870 A1 | 1/2019 | Lloyd et al. |
| 2019/0148858 A1* | 5/2019 | Mason ................ H05K 7/1084 439/67 |
| 2019/0319380 A1 | 10/2019 | Lloyd et al. |

FOREIGN PATENT DOCUMENTS

| | | |
|---|---|---|
| CN | 1316802 A | 10/2001 |
| CN | 1336095 A | 2/2002 |
| CN | 2624465 Y | 7/2004 |
| CN | 1604398 A | 4/2005 |
| CN | 1647323 A | 7/2005 |
| CN | 1647599 A | 7/2005 |
| CN | 1266813 C | 7/2006 |
| CN | 101155037 A | 4/2008 |
| CN | 101656384 A | 2/2010 |
| CN | 101944697 A | 1/2011 |
| CN | 102074825 A | 5/2011 |
| CN | 102365907 A | 2/2012 |
| CN | 102468561 A | 5/2012 |
| CN | 102522645 A | 6/2012 |
| CN | 102986316 A | 3/2013 |
| CN | 203871546 U | 10/2014 |
| DE | 3447556 A1 | 10/1986 |
| JP | 02-079571 U | 6/1990 |
| JP | 04-14372 U1 | 2/1992 |
| JP | 05-059761 U | 8/1993 |
| JP | H10145767 A | 5/1998 |
| JP | 2001244661 A | 9/2001 |
| JP | 2001-313109 A | 11/2001 |
| JP | 2005222537 A | 8/2005 |
| JP | 2007287380 A | 11/2007 |
| JP | 2008-041285 A | 2/2008 |
| JP | 2008-059857 A | 3/2008 |
| JP | 2009-043590 A | 2/2009 |
| JP | 2009094842 A | 4/2009 |
| JP | 2010-017388 A | 1/2010 |
| JP | 2010112789 A | 5/2010 |
| JP | 2010-123274 A | 6/2010 |
| JP | 2011018673 A | 1/2011 |
| JP | 2011103442 A | 5/2011 |
| JP | 2013-016394 A | 1/2013 |
| JP | 2013524443 A | 6/2013 |
| JP | 2014045080 A | 3/2014 |
| JP | 2014204057 A | 10/2014 |
| JP | 2014531723 A | 11/2014 |
| TW | M359141 U | 6/2009 |
| TW | M408835 U | 8/2011 |
| TW | 201225455 A | 6/2012 |
| WO | WO 2008-072322 A1 | 6/2008 |
| WO | 2009147791 A1 | 12/2009 |
| WO | WO 2012-078434 A2 | 6/2012 |
| WO | WO 2013-006592 A2 | 1/2013 |
| WO | 2016/112379 A1 | 7/2016 |
| WO | 2017/127513 A1 | 7/2017 |
| WO | 2017123574 A1 | 7/2017 |

(56) References Cited

FOREIGN PATENT DOCUMENTS

OTHER PUBLICATIONS

Agilent, "Designing Scalable 10G Backplane Interconnect Systems Utilizing Advanced Verification Methodologies," White Paper, Published May 5, 2012, USA.
Amphenol Aerospace, "Size 8 High Speed Quadrax and Differential Twinax Contacts for Use in MIL-DTL-38999 Special Subminiature Cylindrical and ARINC 600 Rectangular Connectors", published May 2008. Retrieved from www.peigenesis.com/images/content/news/amphenol_quadrax.pdf.
Amphenol TCS, "Amphenol TCS expands the XCede Platform with 85 Ohm Connectors and High-Speed Cable Solutions," Press Release, Published Feb. 25, 2009, http://www.amphenol.com/about/news_archive/2009/58.
"File:Wrt54gl-layout.jpg-Embedded Xinu", Internet Citation, Sep. 8, 2006. Retrieved from the Internet: URL:http://xinu.mscs.edu/File:Wrt54gl-layout.jpg [retrieved on Sep. 23, 2014].
Hitachi Cable America Inc., "Direct Attach Cables: OMNIBIT supports 25 Gbit/s interconnections". Retrieved Aug. 10, 2017 from www.hca.hitachi-cable.com/products/hca/catalog/pdfs/direct-attach-cable-assemblies.pdf.
Decision to Grant received for Japanese Patent Application No. 2017-557303, dated Jul. 16, 2019, 5 pages. (2 pages of English Translation and 3 pages of Official notification).
First Office Action received for related CN application No. 201910933045.7, dated Jun. 12, 2020, 22 pages. (11 pages of English translation and 11 pages of Official notification).
Non Final Office Action received for U.S. Appl. No. 16/454,080, dated Oct. 22, 2019, 6 Pages.
Non Final Office Action received for U.S. Appl. No. 16/386,294, dated Jul. 3, 2019, 13 Pages.
Non Final Office Action received for U.S. Appl. No. 17/012,079, dated Feb. 10, 2021, 7 Pages.
Non-Final Rejection received for U.S. Appl. No. 16/110,727, dated Jun. 7, 2019, 22 Pages.
Non-Final Rejection received for U.S. Appl. No. 15/561,100, dated Oct. 31, 2018, 10 Pages.
Decision to Grant received for Japanese Application No. 2018-536097, dated May 28, 2019, 5 pages. (2 pages of English translation and 3 pages of Official copy).
Notice of Allowance received for U.S. Appl. No. 16/069,058, dated May 15, 2019, 8 Pages.
Office Action received for Japanese Patent Application No. 2017-557303, dated Nov. 6, 2018, 10 pages. (5 pages of English Translation and 5 pages of Official Copy).
Office Action received for JP Application No. 2018-170271 dated Oct. 15, 2019, 10 pages.(5 pages of English translation and 5 pages of official notification).
Office Action received for JP Application No. 2019-149015, dated Oct. 6, 2020, 4 Pages. (2 pages of English translation and 2 pages of official notification).
International Search Report and Written Opinion received for PCT application No. PCT/US2017/014089, dated Apr. 20, 2017, 8 pages.
International Preliminary Report on Patentability received for PCT Application No. PCT/US2017/014089, dated Aug. 2, 2018, 7 pages.
Office Action received for Japanese application No. 2018-536113, dated Jul. 9, 2019, 6 pages. (3 pages of English translation and 3 pages of official copy).
International Search Report and Written Opinion received for PCT application No. PCT/US2016/012848, dated Apr. 25, 2016, 11 pages.
International Preliminary Report on Patentability received for PCT Application No. PCT/US2016/012848, dated Jul. 20, 2017, 10 pages.
Office Action received for CN Application No. 201911129759.9, dated Jun. 1, 2021, 12 Pages (06 Pages of English Translation and 06 Pages of Official notification).

\* cited by examiner

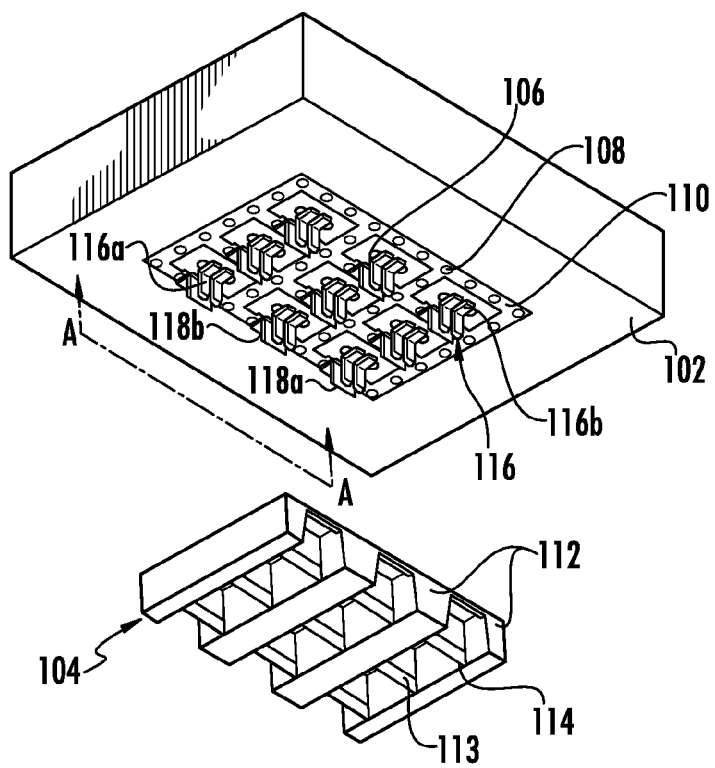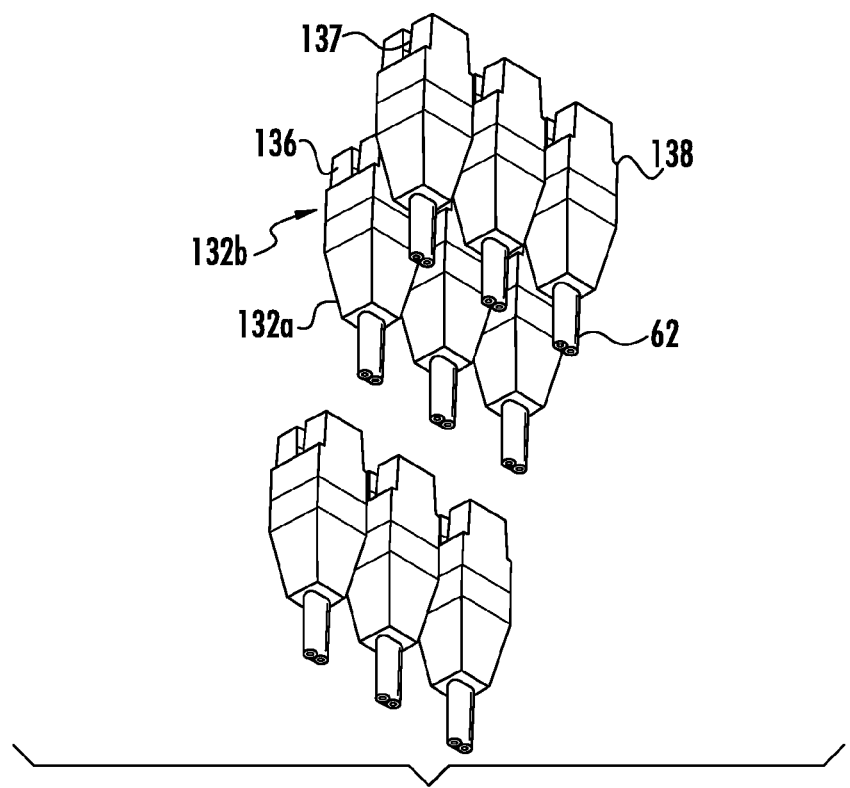
FIG. 5

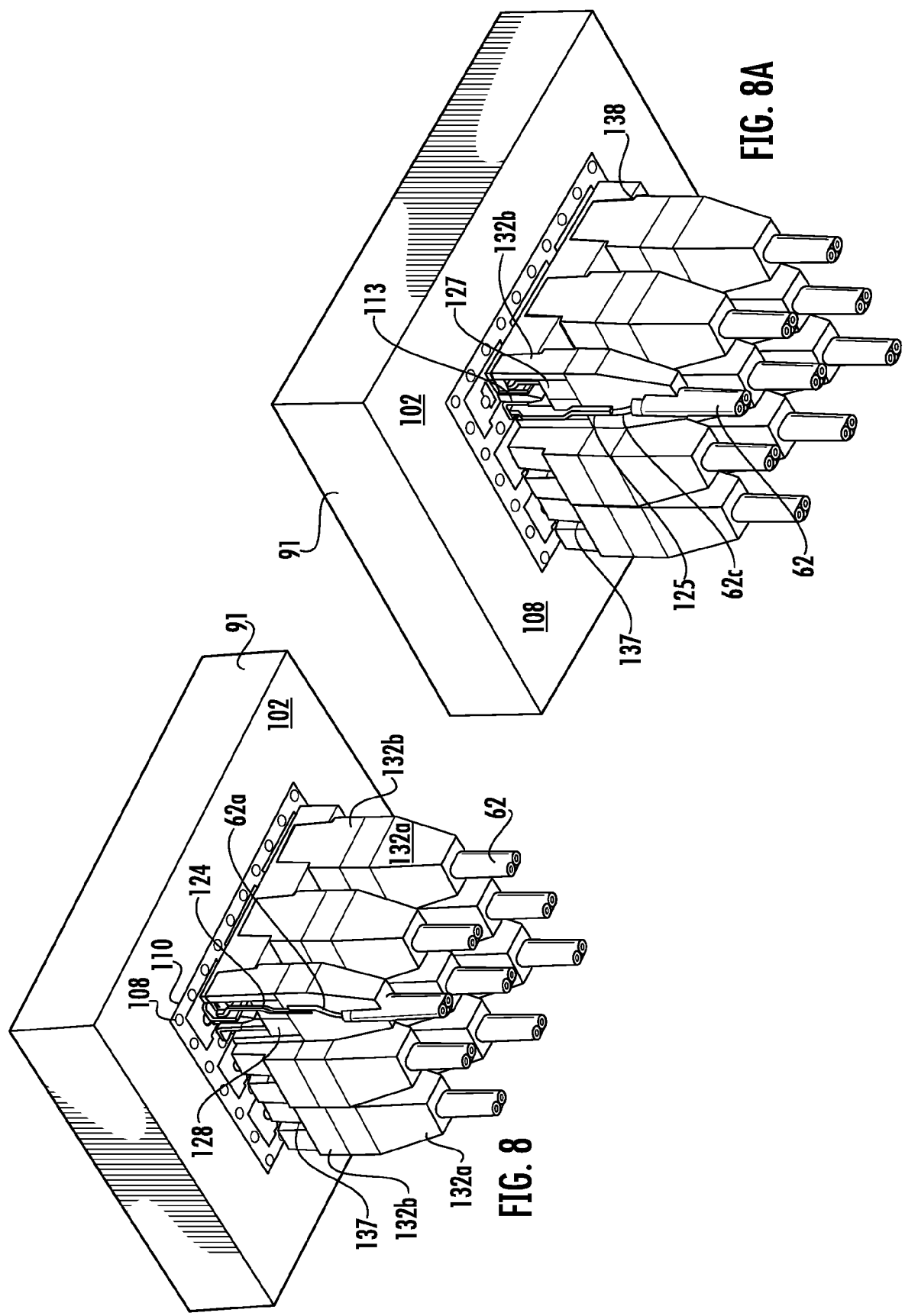

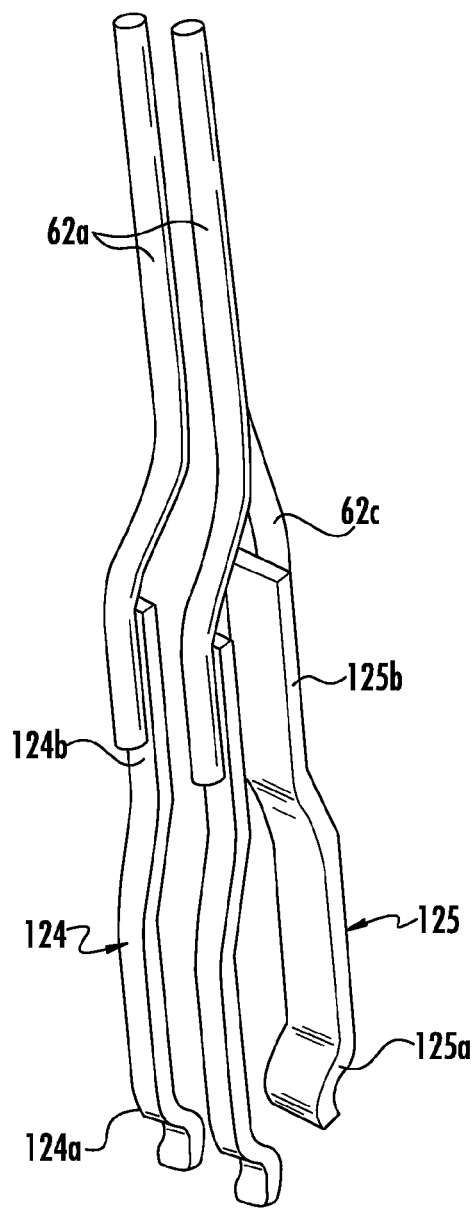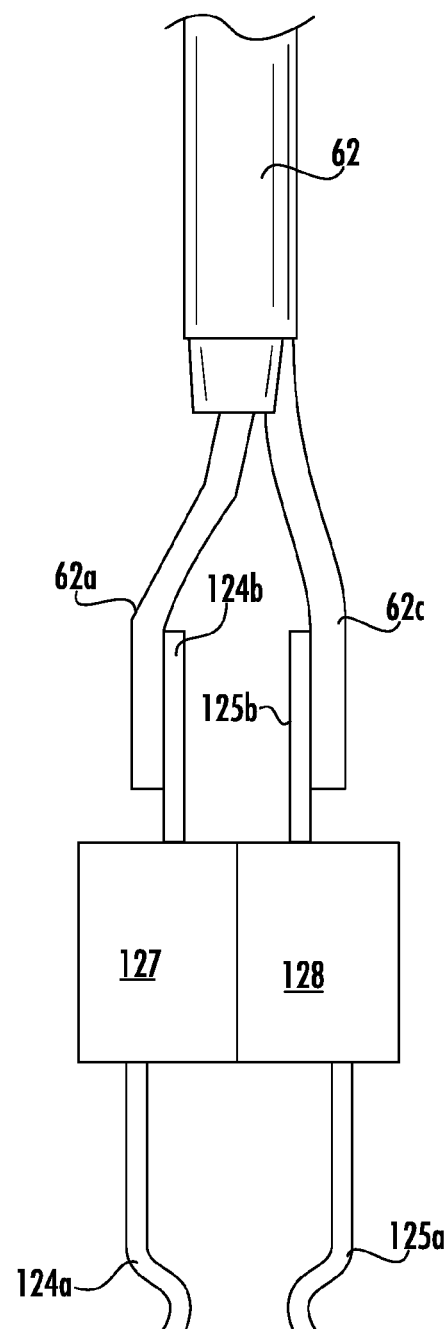
FIG. 9
FIG. 9A

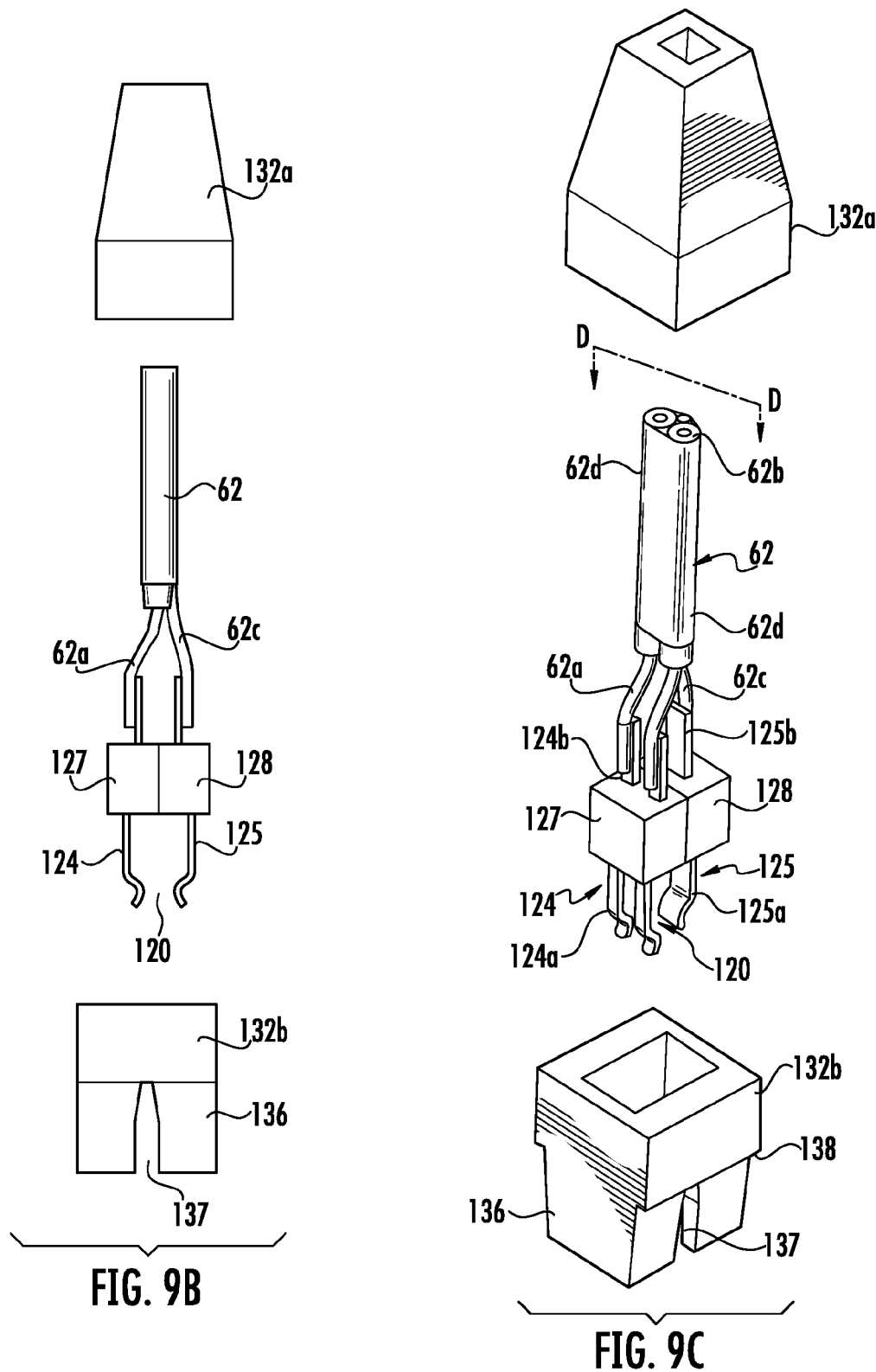

INTEGRATED ROUTING ASSEMBLY AND SYSTEM USING SAME

REFERENCE TO RELATED APPLICATIONS

This application is a national stage of International Application No. PCT/US2017/014089, filed Jan. 19, 2017, which is incorporated herein by reference in its entirety, and which claims priority to U.S. Provisional Application No. 62/280,411, filed Jan. 19, 2016.

FIELD OF INVENTION

The Present Disclosure relates generally to high speed data transmission systems suitable for use in transmitting high speed signals at low losses from chips or processors of a chip package to backplanes and devices, and more particularly to connectors suitable for use in integrated connector interface-chip package routing assemblies and direct connections to a chip or chip package.

BACKGROUND OF THE DISCLOSURE

Electronic devices such as routers, servers, switches and the like need to operate at high data transmission speeds in order to serve the rising need for bandwidth and delivery of streaming audio and video in many end user devices. These devices use signal transmission lines that extend between a primary chip member mounted on a printed circuit board (mother board) of the device, such as an ASIC, FPGA, etc. and connectors mounted to the circuit board. These transmission lines are conductive traces that are formed as part of the mother board and extend between the chip member and connectors to provide that provides a connection between one or more external plug connectors and the chip member. Circuit boards are usually formed from a material known as FR4, which is inexpensive. Although inexpensive, FR4 is known to promote losses in high speed signal transmission lines (e.g., traces) at signaling frequency rates of about 6 GHz and greater. These losses increase as the frequency increases and therefore make FR4 material undesirable for the high speed data transfer applications of about 10 GHz and greater.

In order to use FR4 material, which has the advantage of being a lost cost material, a designer may have to utilize various active components such as amplifiers and equalizers and may need to use additional layers. While losses can sometimes be corrected by the use of amplifiers, repeaters and equalizers, thus allowing the use of FR4 material, the active elements increase the cost of manufacturing the circuit board, which increases the final cost of the device. The use of active components also complicates the design as additional board space is needed to accommodate the active components. In addition, the routing of the signal traces using active components may require multiple turns and transitions. These turns and the transitions tend to decrease the signal to noise ratio, thus negatively impacting the signal integrity of the system.

Custom materials for circuit boards are available that reduce such losses, but the prices of these materials increases the cost of the circuit board and, consequently, the electronic devices in which they are used. And even with more exotic materials the overall length of the transmission lines can exceed threshold lengths at which loss becomes problematic for the system. Significant loss can result as the trace lengths approach 10 inches and longer in length.

In addition to circuit boards being lossy, it can be difficult to route transmission line traces in a manner to achieve a consistent impedance and a low signal loss therethrough. Often, in order to control the impedance in high-speed trace routing design, a designer must utilize extras layers of up to between about 8 to about 16 extra layers to the circuit board. This increases the manufacturing cost of circuit boards and increases the design time required to develop such circuit boards. Thus, existing circuit boards have physical limitations that are becoming more difficult to design around.

Chips (also referred to as die) are the heart of these routers, switches and other devices. Chips typically include a processor, such as an application specific integrated circuit (ASIC) and/or a field programmable gate array (FPGA), as well as other circuitry and can be connected to a substrate by way of conductive solder bumps or other convenient connection. The combination of the chip and substrate form a chip package. The substrate may include micro-vias or plated through holes that are connected to solder balls. If used, the solder balls can provide a ball grid array (BGA) structure by which the chip package can be attached to a motherboard. The motherboard includes numerous traces formed in it that define transmission lines and the transmission lines can include differential signal pairs for the transmission of signals at high data rates, ground paths associated with the differential signal pairs, and a variety of low data-rate transmission lines for power, clock and logic signals as well as other components. These traces can be routed from the chip package to the I/O connectors of the device into which external connectors are connected and can also be routed from the chip package to a backplane connector that allows the device to be connected to an overall system such as a network server or the like.

Chip capabilities have increased to the point where it is possible to support data rates of 25 Gbps and greater. This results in signaling frequencies that can be greater than 12 GHz. It therefore becomes difficult to adequately design signal transmission lines in circuit boards and backplanes to meet the crosstalk and loss requirements needed for high speed applications, especially while trying to maintain reasonable cost. As a results, certain individuals would appreciate further improvements in the system design of routers, switches and other devices.

SUMMARY OF THE DISCLOSURE

The present disclosure is therefore directed to a routing assembly that fits within the housing of an electronic device as a single element and provides multiple data transmission channels that lead directly from a chip package. The transmission channels take the form of cables supported by a routing substrate and the cables can be terminated at their proximal ends to wire-to-board style connectors in a manner that emulates the ordered geometry of the cables. The routing assembly can have an L-shaped configuration that includes a tray that extends horizontally and further includes a pair of side supports that can support an array of connector ports along a mating face of a host device. These connector ports may include cable direct connectors held within housings that define the connector ports. The connector ports receive opposing, mating connectors associated with other devices and which are intended to be connected to the host device.

The connectors, connector ports, cables and/or chip package can be integrated into the routing assembly as a single piece so that the routing assembly can readily inserted into the electronic device as an integrate unit. The tray may be positioned either above or below the motherboard of the host device. The tray can be formed from a dielectric material and may support the cables in a manner to preferably position the proximal ends of the cables in opposition to the chip package. The cables, once connected to the chip package, define high speed signal transmission channels between the chip package and the external connector interfaces, eliminating the need to route the transmission channels on the circuit board reducing the loss problems inherent in circuit board routing. The tray can support the chip package as part of the overall assembly, or it may support only the cables, with board connectors at their proximal ends for connecting to contacts of the chip package. The tray includes a package opening, which can be positioned in opposition to a chip package on the motherboard. In this manner, the package opening surrounds and receives the chip package. The chip package may include a plurality of contacts, such as in the form of a BGA (ball grid array) arrayed along edges of the chip/chip package and aligned with the chip-receiving opening.

BRIEF DESCRIPTION OF THE DRAWINGS

The present disclosure is illustrated by way of example and not limited in the accompanying Figures in which like reference numerals indicate similar elements and in which:

FIG. 5 is an exploded view of the connector assembly of FIG. 4;

FIG. 8 is the same view of the connector assembly of FIG. 4, but with one of the plug connector sectioned to illustrate the connection between the cable signal conductors and the connector assembly plug portion signal terminals;

FIG. 8A is a similar view to FIG. 8, but sectioned differently to illustrate the connection between the cable ground conductor and the ground terminals of the connector assembly plug portion;

FIG. 9 is a perspective view of the conductors of a cable terminated to the conductors of a plug portion of the connector assembly of FIG. 4:

FIG. 9A is an elevational view of FIG. 9, but with the connector assembly plug portion signal and ground terminals held in positioning blocks;

FIG. 9B is an elevational view of the assembly of FIG. 9A, but aligned with its plug portion housing members;

FIG. 9C is a perspective view of FIG. 9B, taken from above;

FIG. 1A is an elevational, diagrammatic view of the connector assembly of FIG. 4, illustrating the preferred manner of connection between the plug and receptacle portions;

FIG. 1B is the same view as FIG. 11A, but taken along lines B-B thereof;

DETAILED DESCRIPTION OF THE DISCLOSURE

Figure 1:
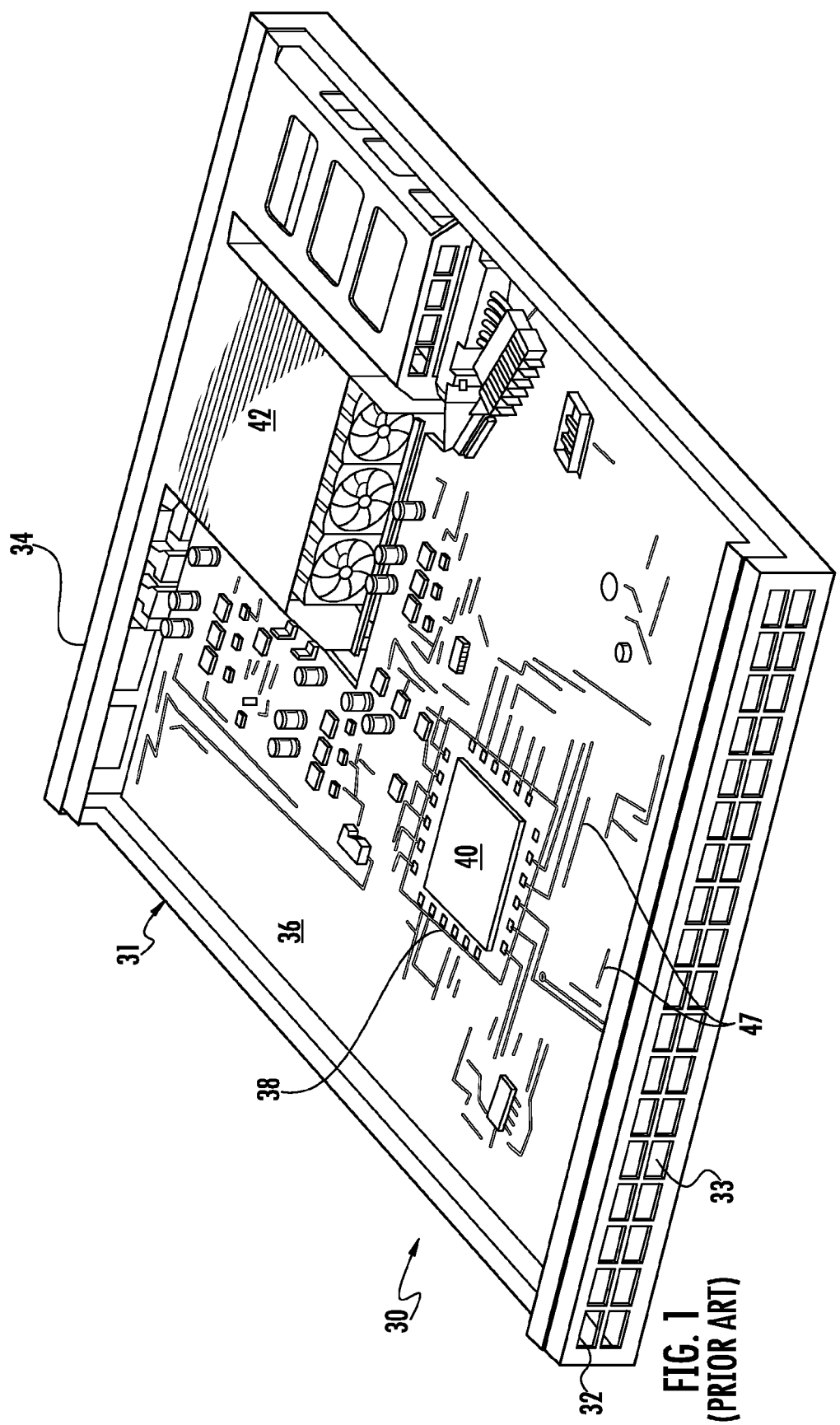
FIG. 1 is a perspective view of the interior of a conventional electronic device with a chip package in place upon a motherboard.

The detailed description that follows describes exemplary embodiments and is not intended to be limited to the expressly disclosed combination(s). Therefore, unless otherwise noted, features disclosed herein may be combined together to form additional combinations that were not otherwise shown for purposes of brevity.

As can be appreciated, the routing assembly can use twin-ax cables as its cables for transmitting differential signals from the chip package to the connector interfaces and vice-versa. The cables have a reduced size and may be either free in their extent between the host device external connector interfaces and chip/chip package contacts, or they may be secured to or integrated with the routing assembly. Each such cable contains two signal conductors and can contain one or more ground conductor that extend in an ordered orientation throughout their length. The proximal ends of the cables extend into the chip-receiving opening and have package connectors configured to terminate the package connectors to corresponding contacts of the chip package.

Due to their size, the cables maybe embedded in the tray so that they are protected from damage during assembly. The tray fits over the motherboard and the package opening fits over the chip package of the motherboard. The package connectors can be flexibly supported by the tray so that they may be manipulated into engagement with opposing connectors on the chip package. With such a structure, the chip package and connector structure may be tested after assembly and prior to shipping to a client or insertion into a device. As can be appreciated, the routing assembly allows for the removal high speed circuit traces on the motherboard and opens up space on the motherboard for additional low speed signal traces and components while avoiding the need for more expensive circuit board materials.

In order to provide a reliable and effective connection between the cables and the chip package, low profile wire-to-board connectors are utilized. The connectors take the form of "chiclets" which are terminated to proximal ends of single cables. The connectors have a structure that emulates the ordered geometry of the cable and has a contact structure that reliably mates with surface contacts such as one signal channel of a ball grid array. In this manner, each such signal channel may be at least partially housed within a single receptacle supported on the chip package in a manner that retains a low profile and with better impedance and signal integrity control.

The depicted connectors include interengaging first and second portions. One portion is configured as a plug connector that is terminated to the free ends of the cable signal and ground conductors. The other portion is configured as a receptacle connector and is terminated to the chip package ball grid array (BGA). The plug connector includes elongated, conductive terminals that have tail portions to which the free ends of the cable signal and ground conductors are terminated. The terminals have corresponding contact portions which are spaced apart from each other and which may be oriented at the apices of an imaginary triangle Each receptacle connector includes a pair of right angle contacts with tail portions which contact corresponding contacts of the chip package BGA. A pair of signal contact portions extend upright from the tail portions into a designated receptacle. A right-angle configured ground terminal is provided and has a tail portion that contacts the ground contacts of the chip package BGA. The ground terminal contact portion extends up from the tail portion and is spaced apart from the signal terminal contact portions. It preferably has a width in opposition to the signal terminal contact portions. The receptacle connector has a dielectric housing that has a plurality of walls that define individual receptacles for each of the cables. The housing may include a wall that extends between and separates the receptacle signal and ground terminals from each other and the dielectric constant of the housing material may be tailored to affect the broadside coupling that occurs between the signal and ground terminal contact portions.

Such a structure is advantageous in that the connectors of the present disclosure are may be made with low profile on the order of about 10 mm so that they may be received within openings of routing assembly openings. The connectors of the present disclosure may also be used to connector chip packages to chip packages and circuit boards together.

Figure 1A:
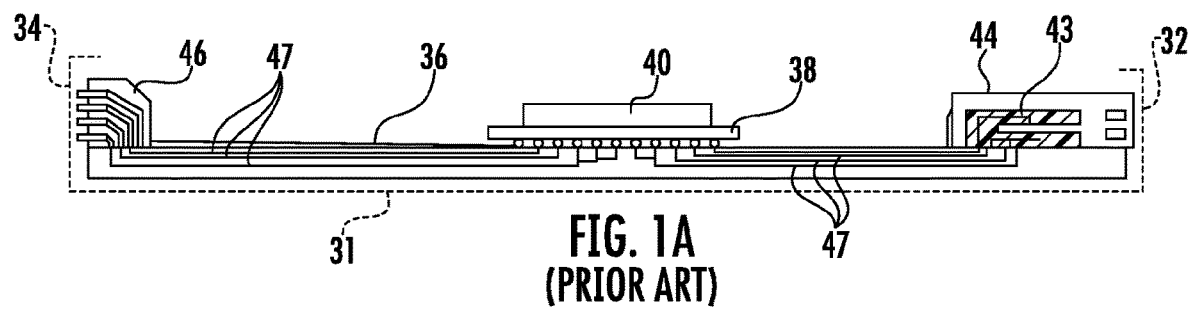
FIG. 1A is a schematic sectional view of the electronic device of FIG. 1 illustrating how the circuit board is used for routing signal transmission channels between the chip package and the external connector interfaces of the device.

FIG. 1 illustrates a conventional electronic device 30, such as a router, switch, etc. that has a sheet metal housing 31 with a front wall 32 and an opposing rear wall 34. The device 30 supports within the housing, a motherboard 36 that includes various electronic components such as a chip package 38 with an associated processor 40, a power supply 42 and additional integrated circuits, connectors, capacitors, resistors, etc. The front wall 32 has a series of openings 33 that are aligned with first connectors 43 to define connector ports for the device 30. Typically, as shown in FIG. 1A, an array of first connectors 43 are mounted to the motherboard 36 at the front end thereof and enclosed within metal shielding cages 44, or adapter frames, that are placed over the connectors 43 and onto the motherboard 36. Likewise, a series of second connectors 46 are mounted along the rear edge of the motherboard 36 and aligned with openings in the rear wall of the housing 31. These second connectors 43 may be of the backplane style which permit the device 30 to be connected to a backplane. In the description that follows, the first connectors will be referred to as "entry" connectors and the second connectors will be referred to as "exit" connectors for the reasons set forth in the "Summary" section above.

In the known structure of the device of FIG. 1, the chip package 38 is connected to the first and second connectors by way of lengthy conductive traces 47 that extend from the chip package contacts through the motherboard 36 to the connectors 43, 46. Pairs of conductive traces 47 are required to define each differential signal transmission line and a third conductive trace will provide an associated ground that follows the path of the signal transmission line. Each such signal transmission line is routed through or on the motherboard and such routing has certain disadvantages. FR4 is the material that is commonly used for circuit boards, and unfortunately, it becomes undesirably lossy at frequencies above 10 Ghz. Turns, bends and crossovers of these signal transmission line traces 47 are usually required to route the transmission line on the motherboard from the chip package contacts to the connectors. These directional changes in the traces can create signal reflection and noise problems, as well as additional losses. Although losses can sometimes be corrected by the use of amplifiers, repeaters and equalizers, these elements increase the cost of manufacturing of the final circuit (mother) board. This complicates the layout of the circuit board because additional board space is needed to accommodate such amplifiers and repeaters and this additional board space may not be available in the intended size of the device. Custom materials for circuit boards are available that are less lossy, but the cost of these materials increase the cost of the circuit board and, consequently, the host devices in which they are used. Still further, lengthy circuit traces require increased power to drive high speed signals through them and, as such, they hamper efforts by designers to develop "green" (energy-saving) devices.

In order to overcome these actual disadvantages, we developed an integrated routing assembly 50 that incorporates the external connector interfaces, cables and support into a single assembly for use in the host device 51. The routing assembly provides a support for high speed differential pair signal transmission lines by way of elongated cables 62 that extend between the connector interfaces and the chip package 88, thereby eliminating the need for high speed routing traces on the motherboard 53. Such an assembly is illustrated at 50 in FIG. 2. The assembly 50 includes a front portion that accommodates a plurality of external connector interfaces in the form of first connectors 55, 57 and their associated housings 60. These are arranged in preselected arrays, which are illustrated as four horizontal rows of connector housings 60 stacked vertically upon each other.

The connector housings 60 selectively contain the first connectors 55, 57 and these cooperatively define the external connector interfaces for the device 50. These connector interfaces are connector ports 54, 56 and each such connector housing 60 contains one of the first connector 55, 57, which are preferably in a receptacle style with a card slot (such as is used with QSFP style connectors) and the connector ports 54, 56 can be arranged in an N by M array where both N and M are equal to or greater than two. It should be noted that the first connectors 55, 57 are shown positioned on a front side of a system but could also be positioned elsewhere, depending on system designs. Consequentially, the present disclosure is not to be considered as limited to certain connectors at certain locations.

Figure 2:
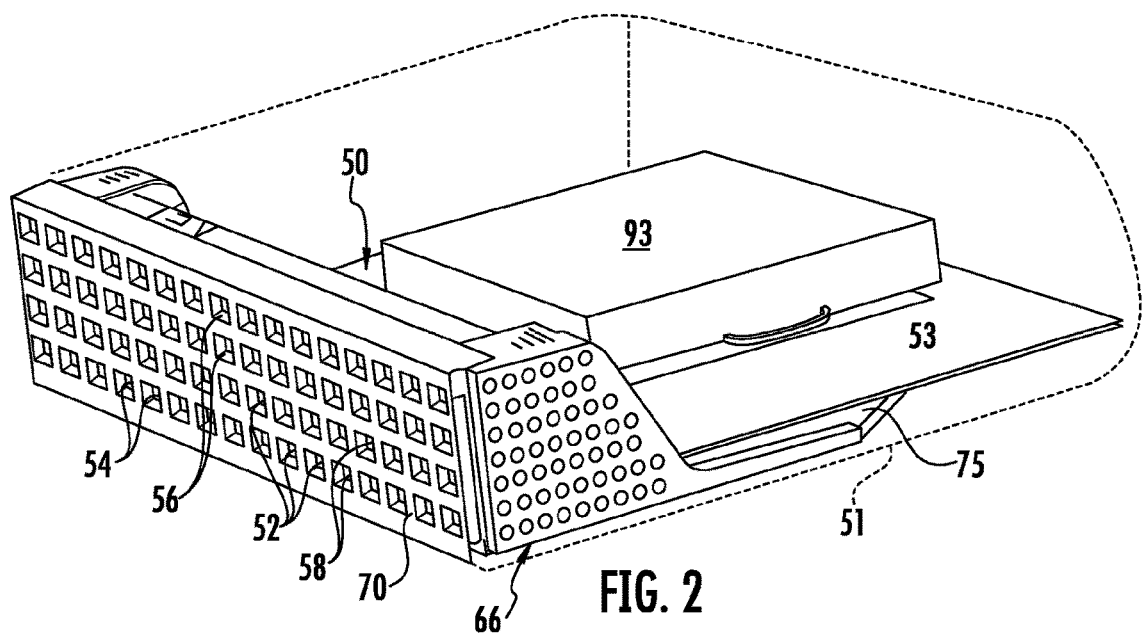
FIG. 2 is a perspective view of a routing assembly of the present disclosure in place underneath a motherboard and in which the chip package has a heat sink in place thereon.
Figure 3:
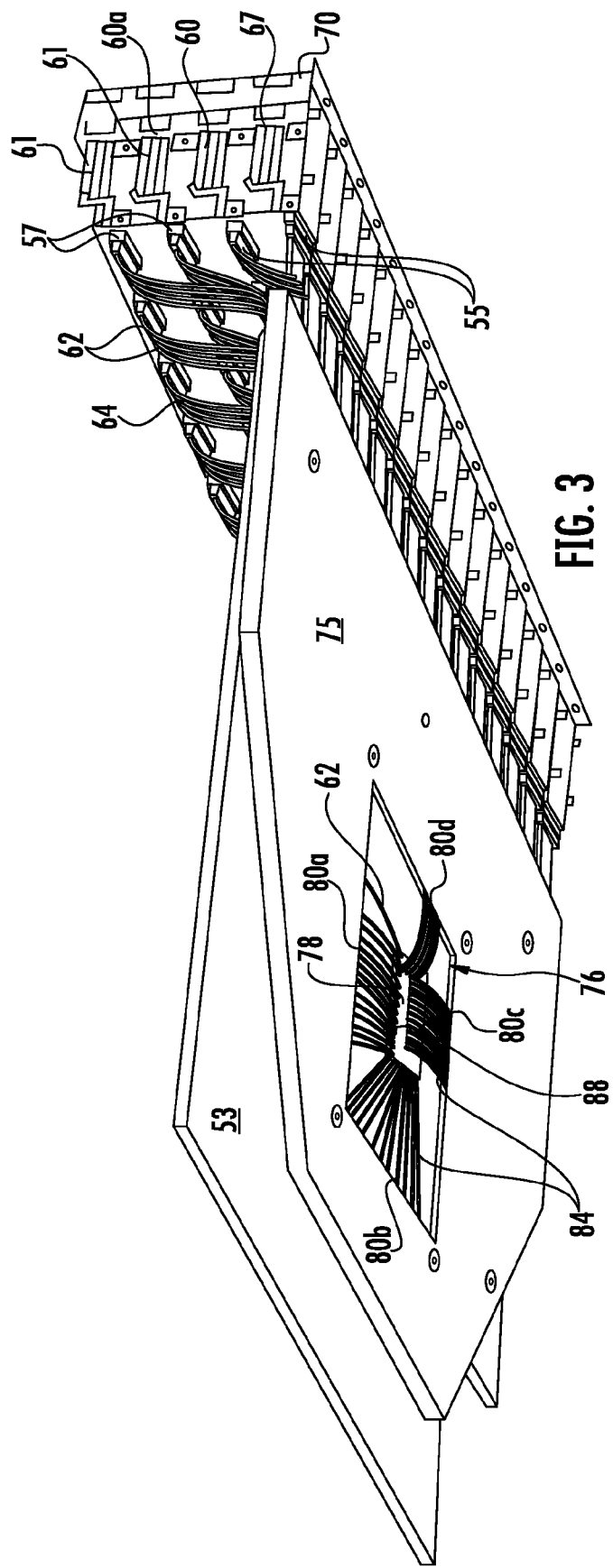
FIG. 3 is a perspective view of the routing assembly in place underneath a host device motherboard and contacting the chip package from below.

The first connectors 55, 57 can be arranged in horizontal rows in an integrated fashion as in FIGS. 2 & 3, where the connector housings 60 and associated connector heat sinks 61 are held in their horizontal extent and vertical alignment between support boards 67, by way of fasteners, such as screws, that extend through bosses 60a formed on the exterior of the connector housings 60. Such an arrangement can easily accommodate a face plate 70, or panel, (FIG. 3) that extends widthwise between two side supports 68 to form a frame 66 of the assembly 50. The side supports 68 have rearwardly extending channels 72a, b that cooperatively define a plane in which a routing substrate 75 extends, which, in combination with the connector housings, define a tray-like system with a general L-shaped configuration that is readily insertable into a host device housing.

The routing substrate 75, as illustrated in FIG. 3, can be planar and has a predetermined thickness. The depicted routing substrate 75 has an opening 76 formed therein, which is shown in the Figures as located within a perimeter of the routing substrate 75, so as to provide access to a chip package 88. The opening 76 is shown as having a central portion 78 that may have four edges 80a-d that define the opening 76. In alternative embodiments the routing substrate 75 can simply end (e.g., have a rear edge) prior to the chip package 88. If provided, the opening 76 can extend around the chip package 88. As depicted, cables can extend toward out of the routing substrate 75 and toward the chip package 88 in at least two directions (as depicted, from four directions).

Figure 9D:
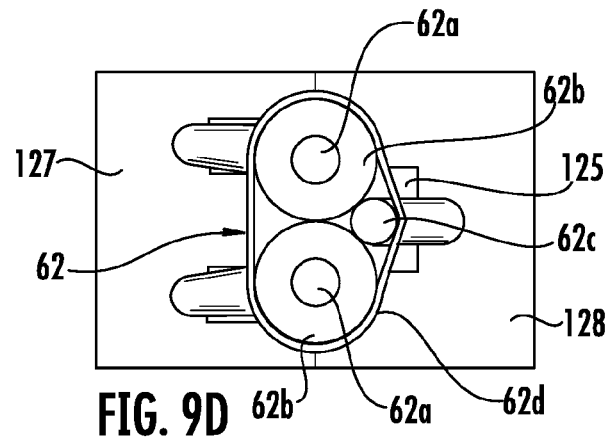
FIG. 9D is a plan view of the assembly of FIG. 9C, taken along lines D-D thereof.

The first connectors 55, 57 that form the array of connector ports 54, 56 have signal and ground terminals arranged in transmit and receive channel configurations to mate with opposing connectors having a plug style. Cables 62, which preferably are in a twin-ax configuration, are directly terminated at their first ends 82 to the connector terminals of each connector 55, 57 and are seen in FIG. 3 to flank low speed wires 64 (which can be used for power, logic, clock and other circuits). As illustrated in FIG. 9D and as is known in the art, each cable 62 includes a pair of signal conductors 62a surrounded by a dielectric covering 62b and may include an associated drain wire 62c, all of which are enclosed in an insulative outer jacket 62d. The cables 62 maintain the ordered geometry of the signal conductors 62a throughout their lengths as they traverse from the chip package 88 to the entry and exit connectors 54, 56. Because this geometry remains ordered through their length, the cables 62 may easily be turned or bent or crossed in their paths without introducing problematic signal reflection or impedance discontinuities into the transmission lines.

Both the cables 62 and low speed wires 64 are terminated directly at their first ends to the connector terminals. This allows the first connectors 55, 57 to avoid being mated to a motherboard 53 and eliminates the impedance discontinuities which normally occur at a connector-circuit board mounting interface. The depicted cables 62 are illustrated as arranged in vertical rows at the rear of the connector housings 60, with the cables 62 and wires 64 of the lower connector housing rows arranged inwardly of the topmost connector housing row. This promotes orderly arrangement of the cables 62 in their extent from the connectors 55, 57 to the routing substrate 75. In the assembly 50 depicted the cables 62 associated with the top three rows of connectors 55, 57 are seen to have a general S-shaped configuration extending downward to the level of the routing substrate 75 and into the substrate at the front end thereof, while the cables in the bottommost row extend almost horizontally into the routing substrate 75.

Figure 2A:
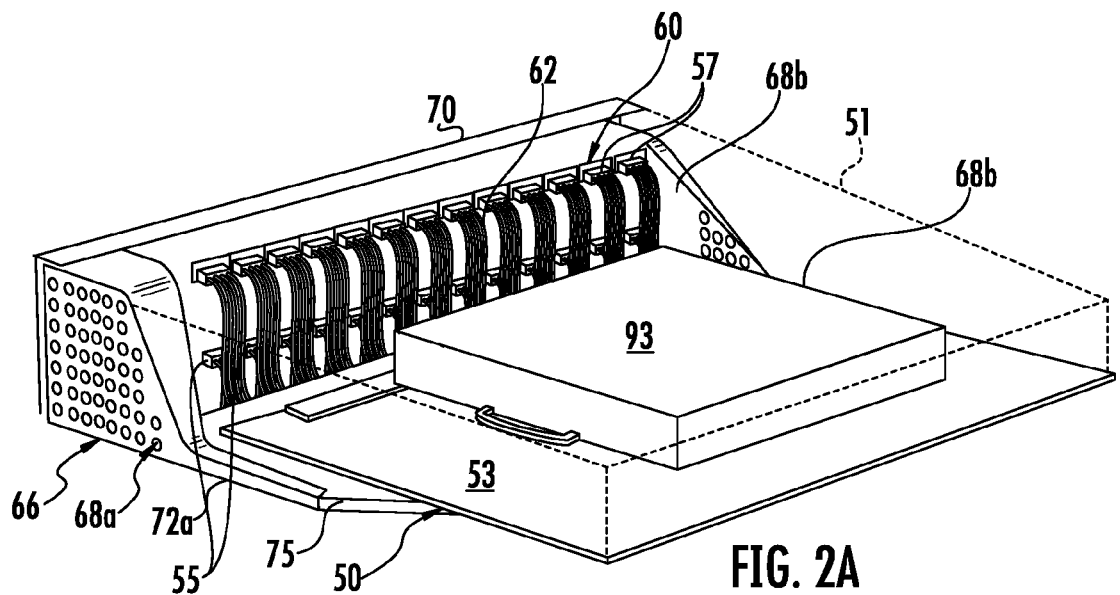
FIG. 2A is the same view as FIG. 2, but taken from the rear.
Figure 2B:
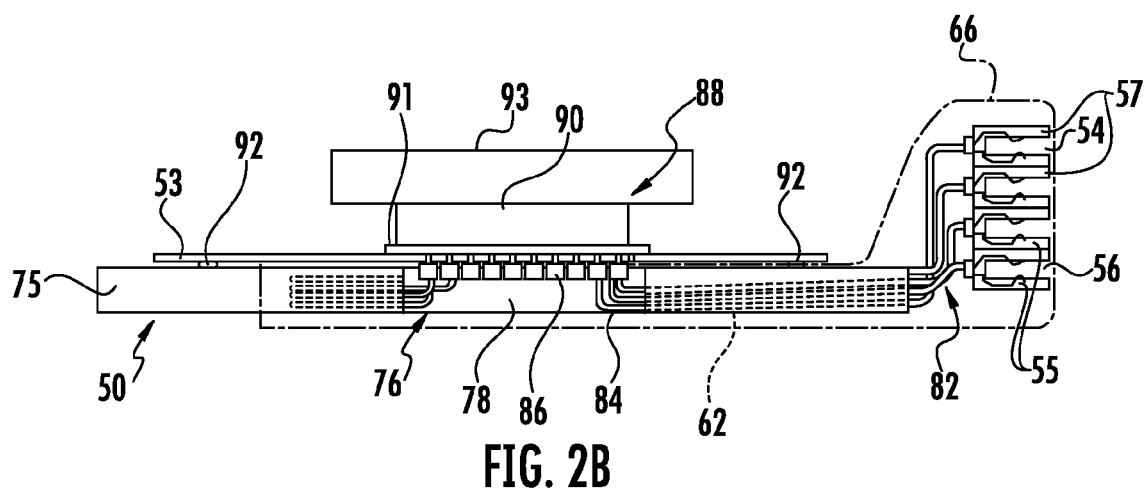
FIG. 2B is a schematic sectional view of the routing assembly of FIG. 2 illustrating how the cables are embedded within the routing substrate for routing signal transmission channels between a chip package substrate and the external connector interfaces of the assembly.

The cables 62 lead from the rear of the connectors to the front edge of the routing substrate 75 where they enter the body of the routing substrate 75. The second ends 84 of the cables 62 extend into the opening 76 as illustrated where they are terminated to second connectors 86 that will mate with the chip package 88. The second connectors 86 can be a wire-to-board style so that the signal conductors and drain wires of the cables 62 can be easily connected to contacts on the substrate 91. The second ends 84 of the cables 62 exit the routing substrate to enter the opening 76. In one embodiment, the chip package 88 is disposed on the device motherboard 53, and the chip package 88 includes a plurality of contacts that can mate with the second connectors 86 and can preferably be arranged around the perimeter thereof and aligned with the opening 76 so as to align with the second connectors 86. In another aspect, the chip package 88 may be included as part of the overall routing assembly 74. As can be appreciated, as illustrated in FIGS. 2 & 2A, the area above the host device motherboard 53 is free to accommodate thermal transfer members 93, such as heat spreaders and/or heat sinks having perimeters larger than that of the processor 90. This is because the integration of the cables 62 into the routing substrate 75 frees up most, if not all, of the space above the routing substrate 75 for other uses.

Figure 5A:
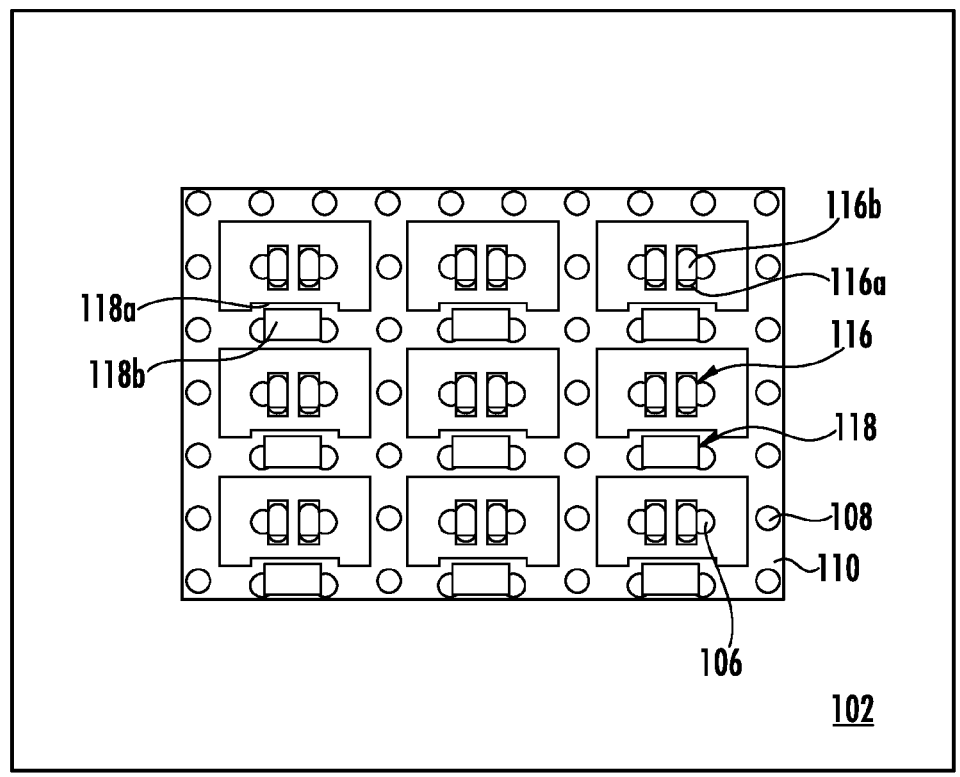
FIG. 5A is a plan view of the bottom of the receptacle connector portion terminals in place upon a surface of the chip package substrate, taken along lines A-A of FIG. 5.

The cables 62 may be positioned as part of the routing substrate 75 in a variety of ways that suitably holds them in place from where they enter the routing substrate 75, such as along the leading edge 83 of the routing substrate 75 to where they exit the routing substrate 75 and enter the opening 76. The cables 62 can be securely embedded in the routing substrate 75 by the use of adhesives or other known fastening techniques that positions them securely in position. The body portions of the cables 62 are preferably completely surrounded by the routing substrate 75 so that the two are integrally formed as a single part that can be inserted into the routing assembly 74 as a tray portion. One routing pattern of the cables 62 is illustrated in FIG. 5, which has the upper portion of the routing substrate 75 removed for clarity to show the paths in which the cables 62 are laid. It can be appreciated that the routing substrate 75 can be formed of insulative or conductive materials, depending on the shielding needs of the system.

Figure 3A:
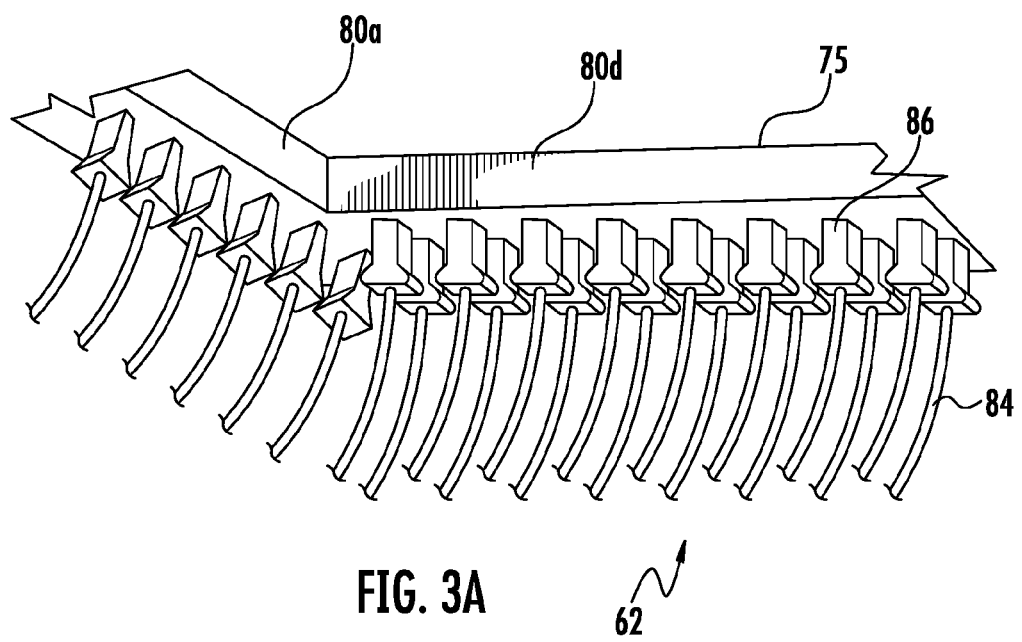
FIG. 3A is an enlarged diagrammatic view of a portion of the routing assembly of FIG. 3, illustrating a series of wire-to-board connectors of the present disclosure with their corresponding receptacles removed for clarity and which connect the cables to the chip package of the host device.

The cables 62 are terminated at their second ends 84 to the second connectors 86 either before or after the forming of the routing substrate 75. Inasmuch as the first ends of the cables 62 are directly terminated to the terminals of the first connectors 55, 57 the second connectors 86 permit the cables 62 to be directly connected to the chip package 88, thereby substantially or completely bypassing the motherboard 53 as a signal routing medium. In such an instance, the routing assembly 74 may be mated to the motherboard before the routing assembly 74 and the motherboard 53 are inserted into the host device housing, where the routing assembly 74 may be spaced apart from the motherboard by standoffs 92 or the like. FIGS. 3 & 3A illustrate the second connectors 86 and their associated housings 87 and mating faces 89 facing upwardly in the opening 76 so as to provide a connection to the chip package 88. The second connectors 86 are illustrated in the form of chiclets, each of which houses a single signal transmission channel which includes the twin-ax cable pair of signal conductors and an associated drain wire. The second connectors 86 easily mate with small-sized receptacle connectors mounted on the substrate 91 or a motherboard 53. The second connectors 86 and their mating receptacle connector portions may be made small in dimension so as to fit within the opening 76 and not unduly project outside of the opening 76.

Figure 4:
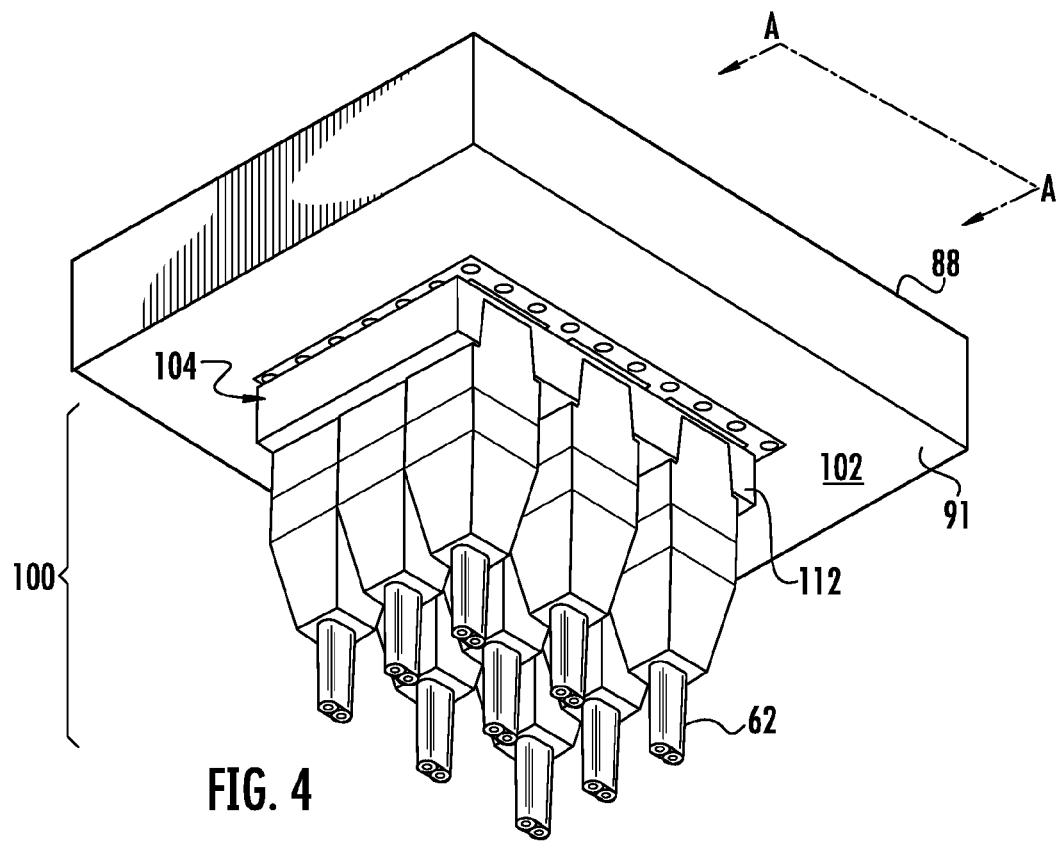
FIG. 4 is a perspective view of a wire-to-board connector assembly of the present disclosure which mates nine cables to the underside of a chip package or a chip package substrate.
Figure 4A:
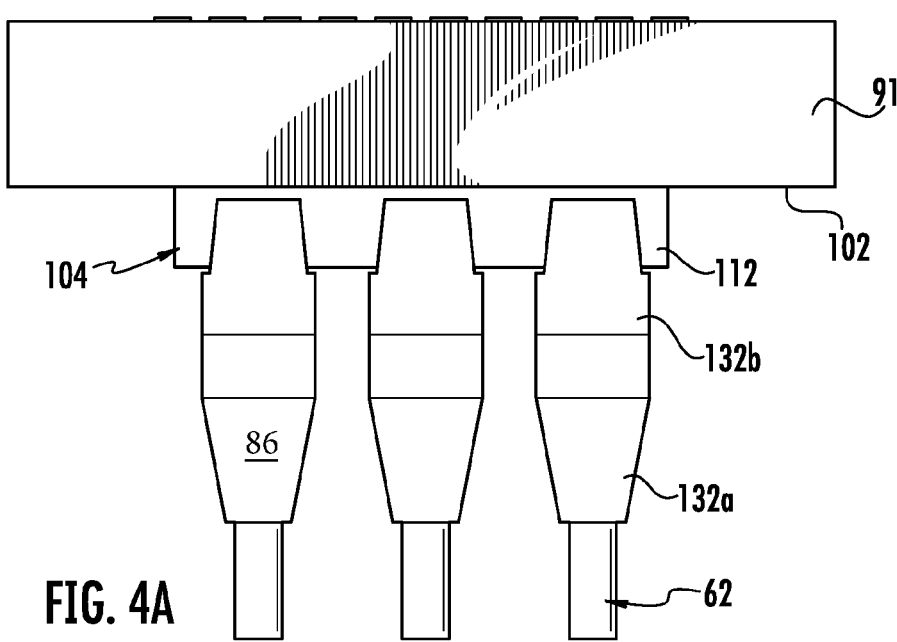
FIG. 4A is an elevational view of the connector assembly of FIG. 4, taken along lines A-A thereof.
Figure 5B:
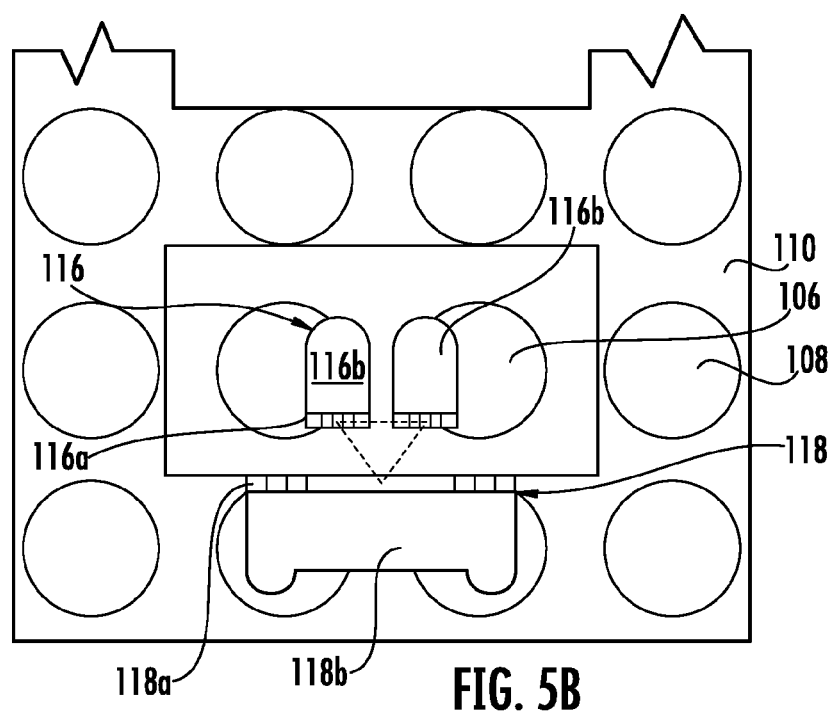
FIG. 5B is an enlarged detail view of one set of terminals in place with contacts of the chip package substrate.
Figure 5C:
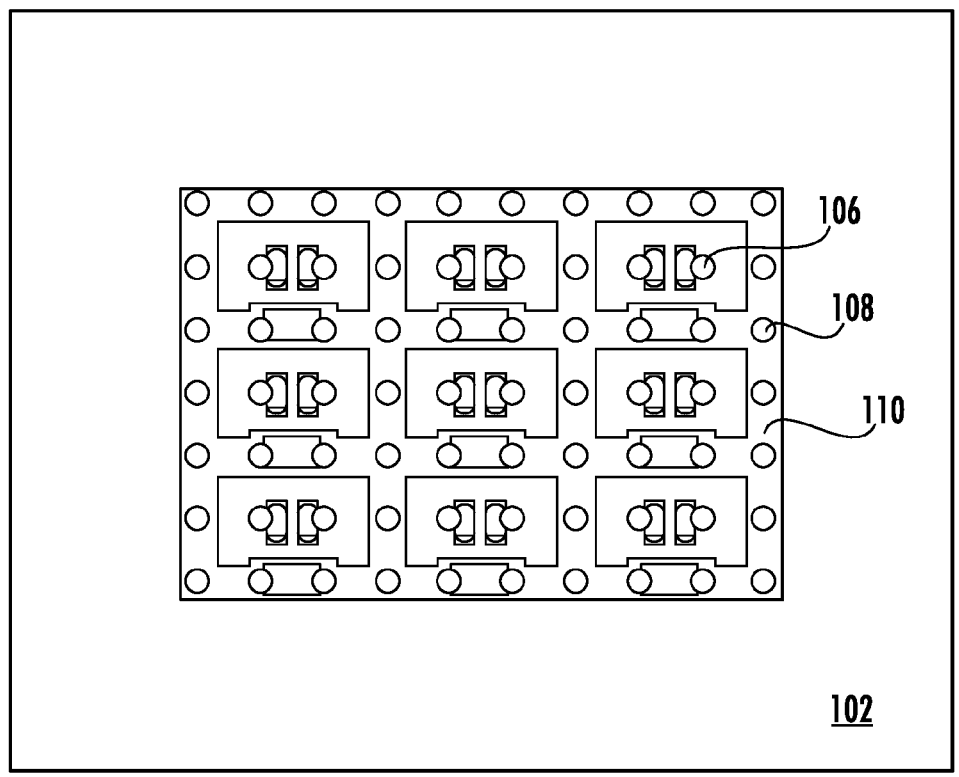
FIG. 5C is the same view as FIG. 5A, but with the terminals removed to illustrate the contacts of the chip package substrate.

FIGS. 4-5 illustrate a connector assembly 100 that connects the conductors of a cable to circuits on a circuit board or similar substrate. The connector assembly 100 includes the second connector and a third connector and is particularly suitable for use with the bypass routing assemblies described above. The connector assembly 100 is shown connecting to a surface 102 of a substrate 91. The surface 102, which could be a top surface or a bottom surface, has a plurality of contacts, shown in FIGS. 5 & 5C as a ball-grid array ("BGA") that includes signal contacts 106, preferably in the form of solder balls or the like, and similar ground contacts 108 which, as illustrated, may be connected together in the manner of a ground bus by interconnecting strips, or traces 110, in the form of a grid.

The third connector 104 has a dielectric housing that may also be considered as having a grid configuration that is formed by main walls 112 and secondary walls 113 that intersect each other to form one or more individual receptacles 114, each of which receives one of the second connectors 86 therein. The secondary walls 113 of the housing seen to have a height that is less than that of the main walls 112.

Figure 6:
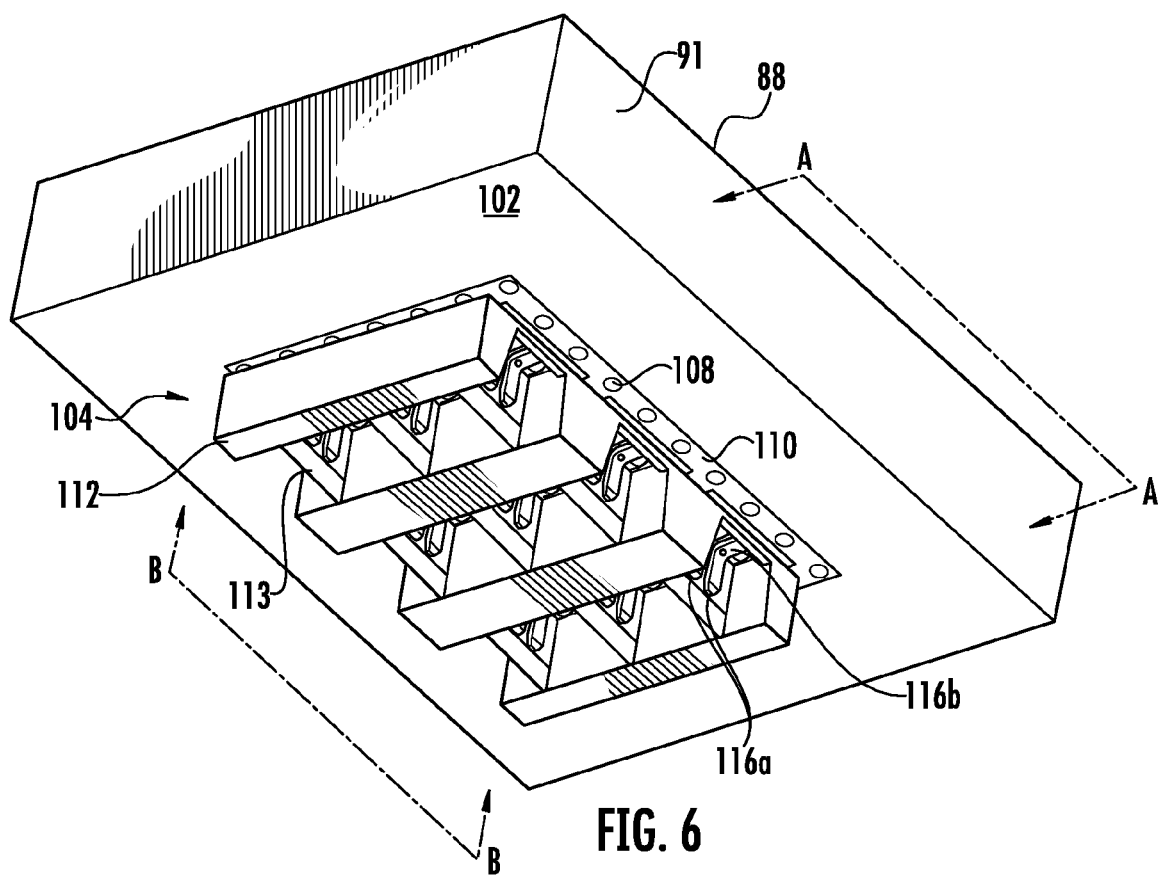
FIG. 6 is a perspective view of the receptacle portion of the connector assembly of FIG. 4 in place on the chip package substrate.
Figure 6A:
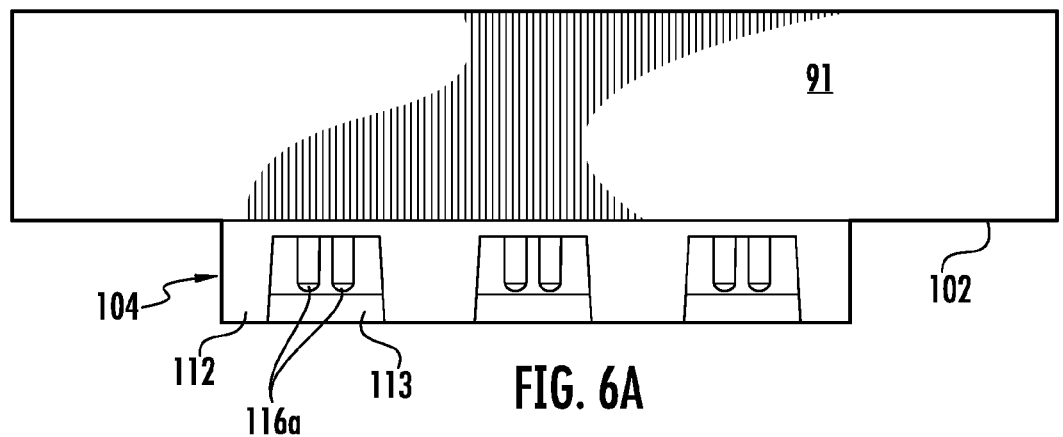
FIG. 6A is a side elevational view of the connector assembly of FIG. 6, taken along line A-A thereof.
Figure 6B:
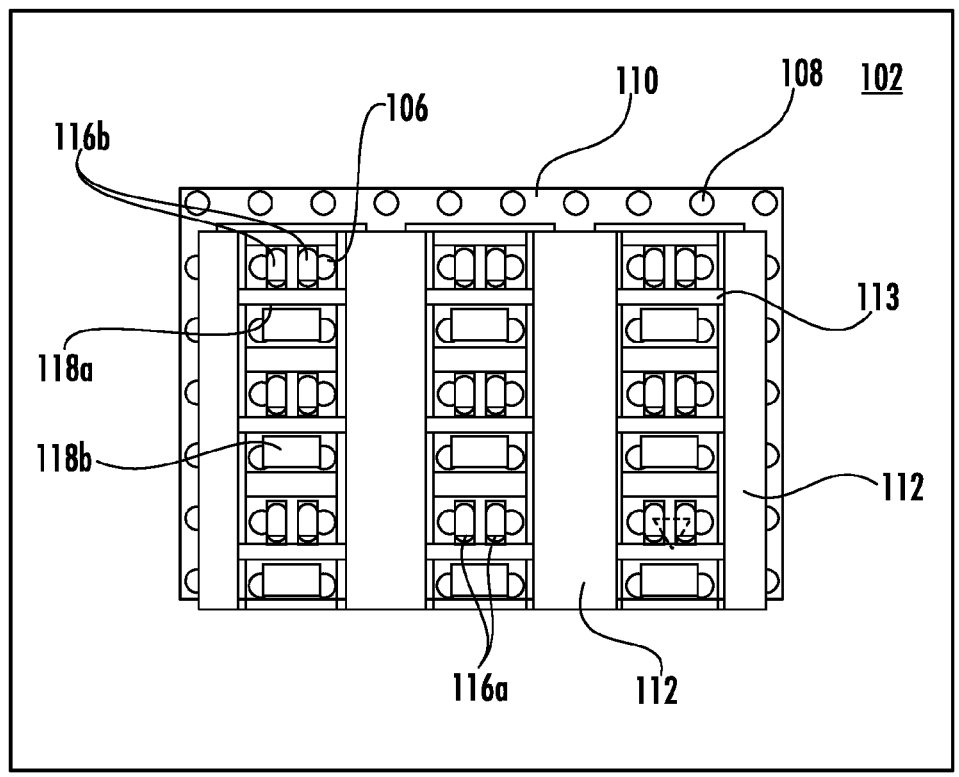
FIG. 6B is a plan view of the connector assembly receptacle portion of FIG. 6, taken along lines B-B thereof.
Figure 6C:
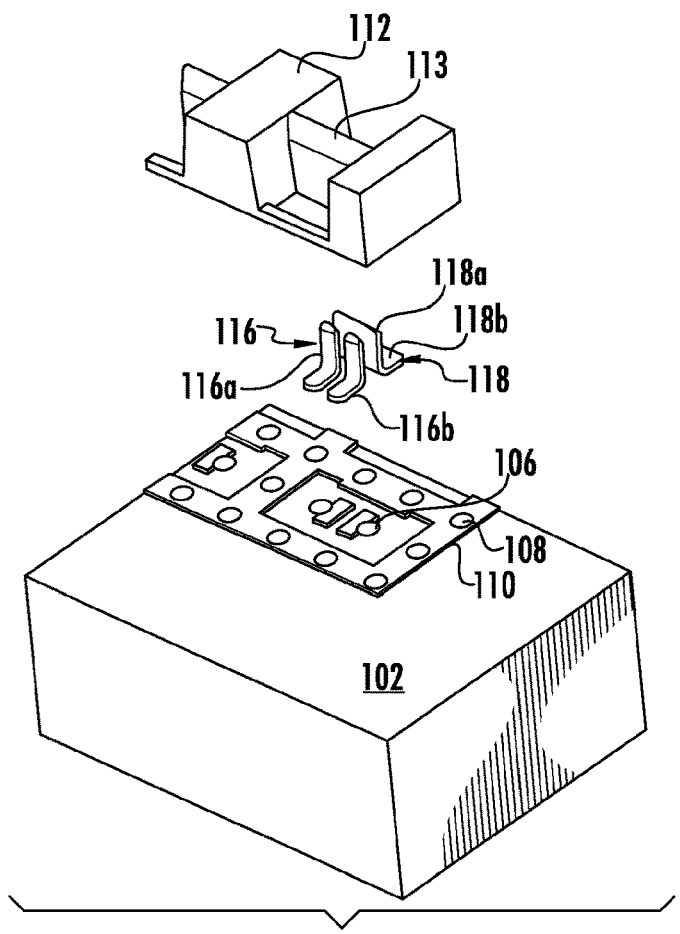
FIG. 6C is an enlarged detail view of one differential signal transmission channel of the connector assembly receptacle portion of FIG. 6.
Figure 7:
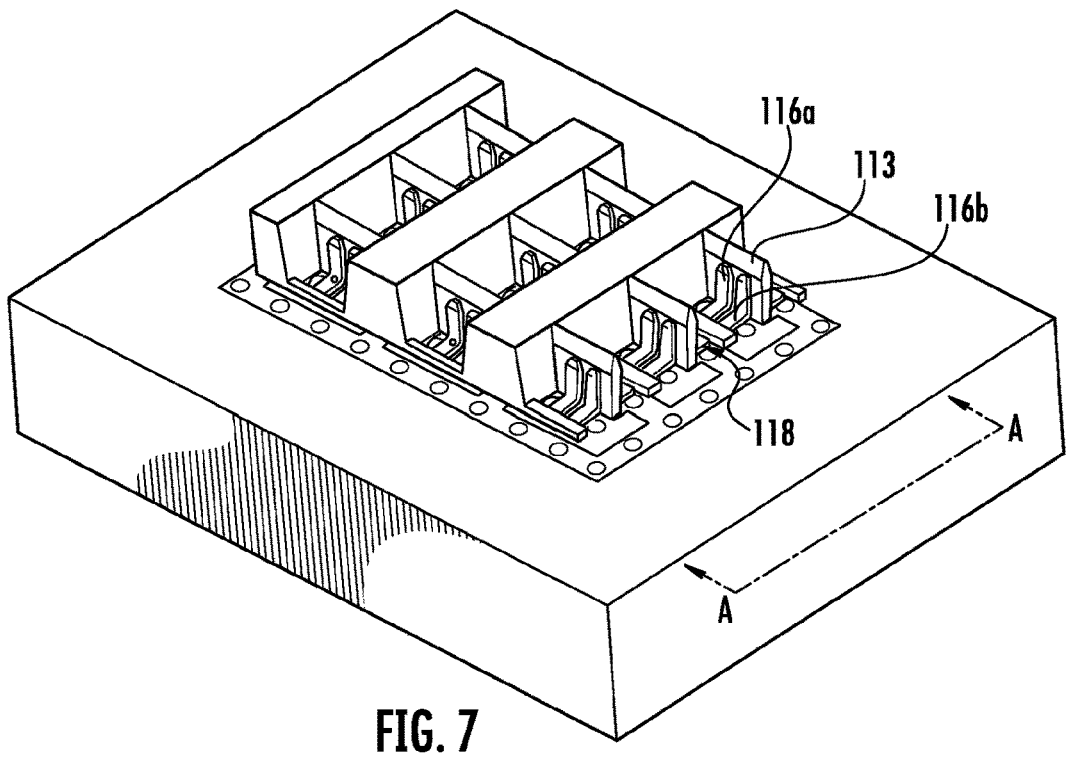
FIG. 7 is the same view as FIG. 6, but with a near end wall thereof removed for clarity.
Figure 7A:
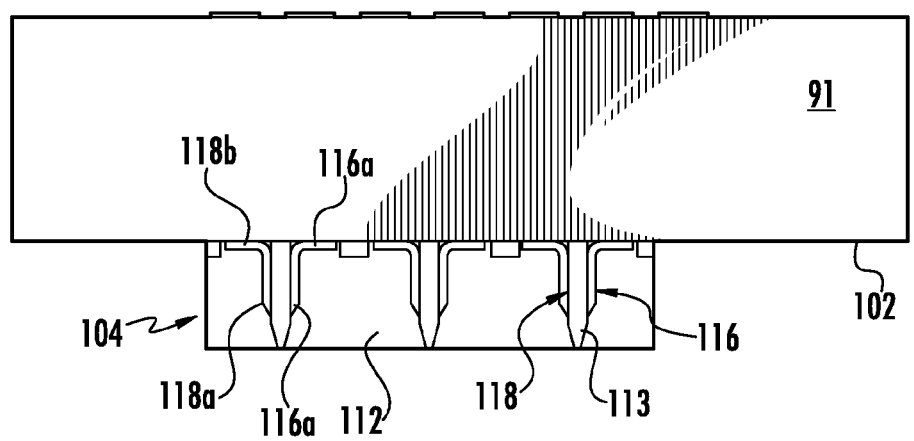
FIG. 7A is an elevational view of the receptacle portion of the connector assembly of FIG. 7, taken along lines A-A thereof.
Figure 8B:
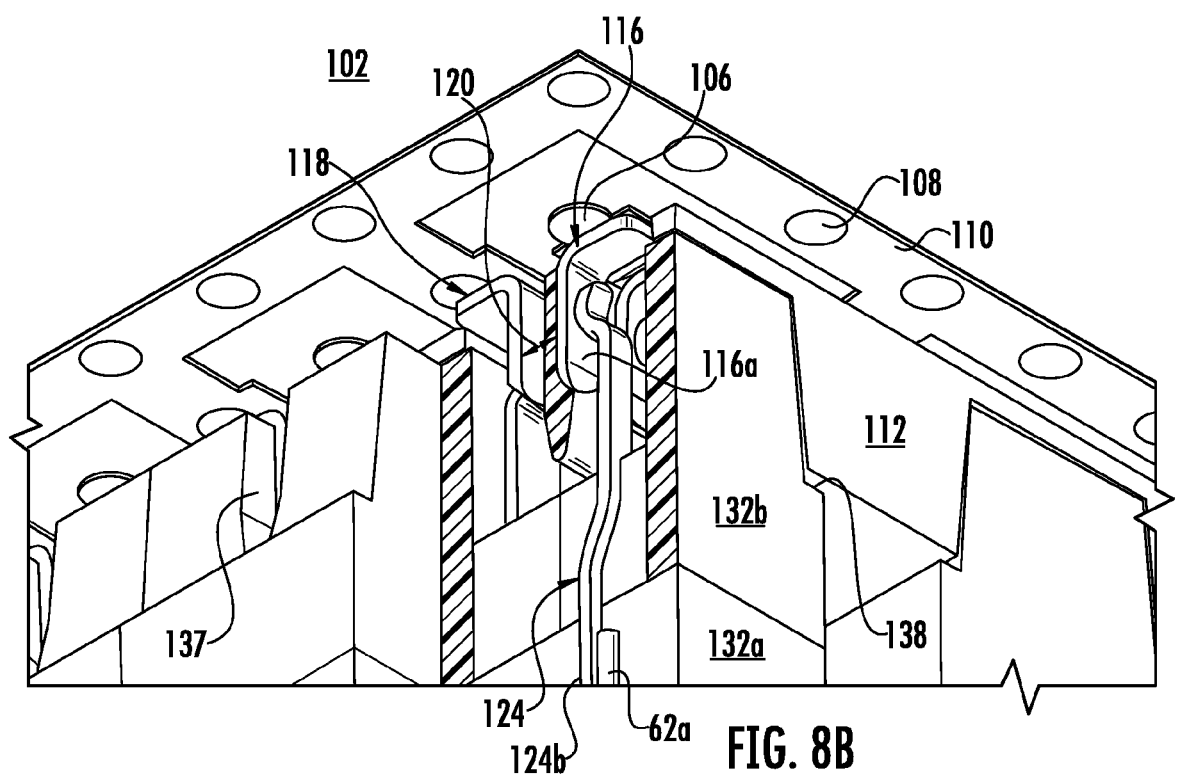
FIG. 8B is an enlarged detail view of a portion of FIG. 8.
Figure 8C:
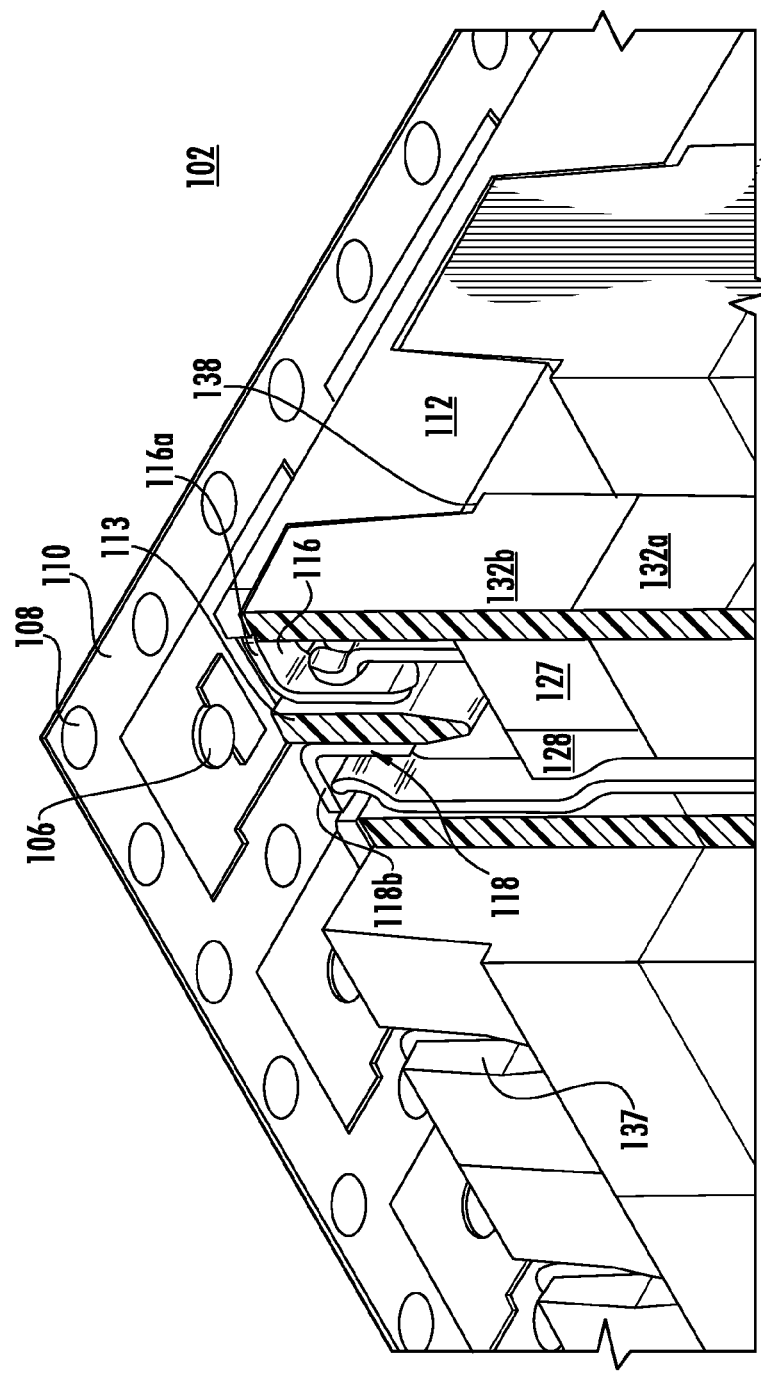
FIG. 8C is an enlarged detail view of a portion of FIG. 8A.
Figure 8D:
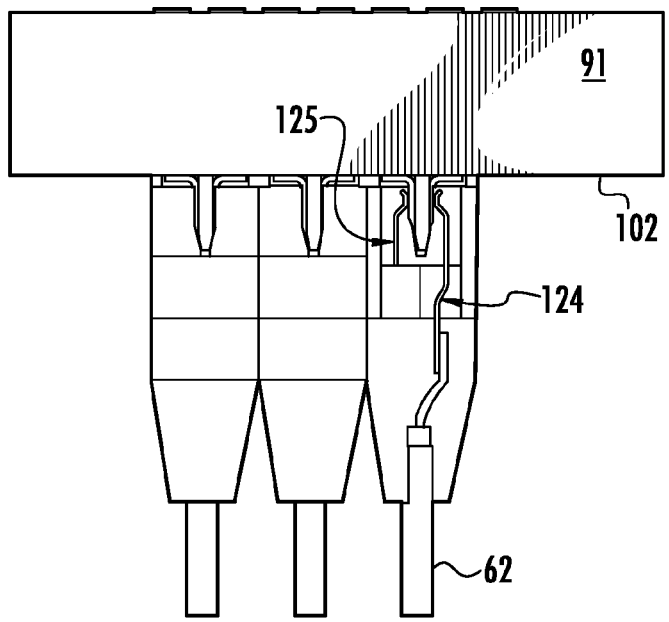
FIG. 8D is a side elevational view of the connector assembly of FIG. 8.
Figure 8E:
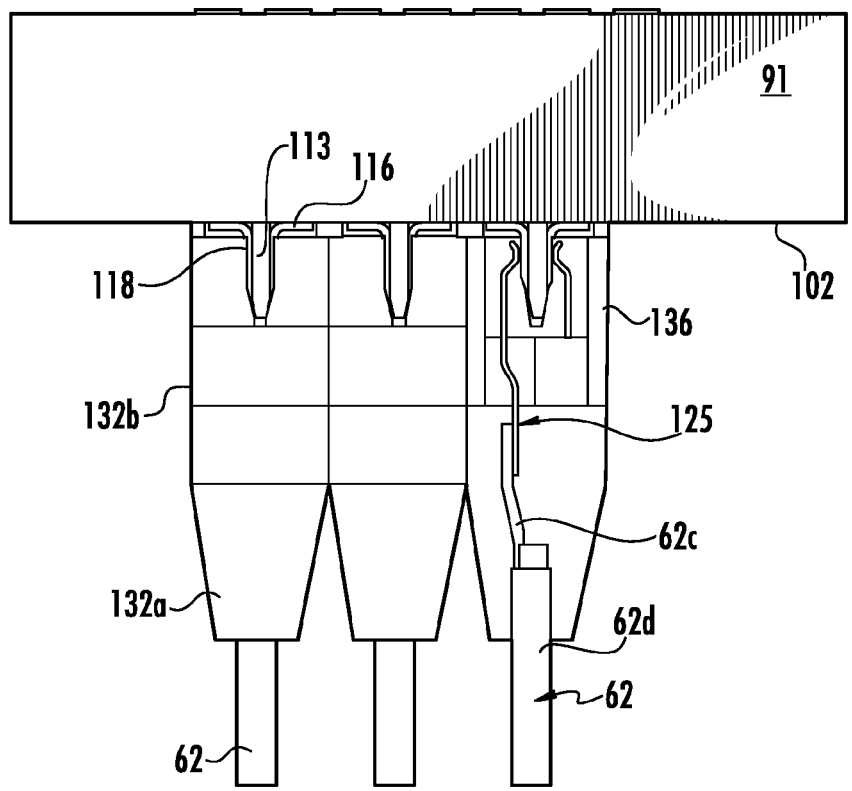
FIG. 8E is a side elevational view of the connector assembly of FIG. 8A.

As can be appreciated, the third connector 104 includes conductive terminals 116, 118 arranged in individual sets of three terminals. Each such set of terminals includes two signal terminals 116 and an associated ground terminal 118 are housed in a single receptacle 114 to form a connection between a single set of terminals and a respective circuit on the chip package 88. The receptacle terminals 116, 118 mate with corresponding terminals of a second connector 86 connected to the conductors 62a, 62c of a corresponding cable 62. The receptacle terminals 116, 118 may be considered as arranged in a triangular pattern, with imaginary lines extending from the center point of each terminal contact portion defining an imaginary triangle. (FIG. 5B.) The top edges 116c, 118c of the signal terminals 116 and ground terminals 118 are shown extending along parallel, spaced-apart paths separated by an intervening space 120. As shown in FIGS. 6, 6B & 7A, the secondary walls 113 are shown to extend within and fill these intervening spaces 120.

The signal terminals 116 have tail portions 116b that extend horizontally and which are contacted to the opposing corresponding signal contacts 106 on the BGA. Likewise, the ground terminals 118 also have a tail portions 118b. The signal and ground terminals 116, 118 have contact portions 116a, 118a that extend vertically from the chip package surface 102 within the receptacles 114. The rear surfaces of the signal and ground terminal contact portions 116a, 118a, preferably abut the opposing surfaces of the intervening secondary walls 113. In this manner, the secondary walls 113 reinforce the terminal contact portions 116a, 118a to resist deflection (in at least the horizontal direction) which may occur in response to insertion forces applied to them during the mating of the two connector portions 86, 104. The depicted design thus allow for the use of insertion normal forces of about 40 grams. The right angle nature of the terminals 116, 118 can meet small BGA spacing, such as about 1 mm. As shown in FIG. 6B, the signal terminals 116 are arranged in rows. The rows of signal terminals are separated by intervening rows of ground terminals 118. Adjacent pairs of signal terminals are separated from each other by the main walls 112 of the connector 104.

Figure 10:
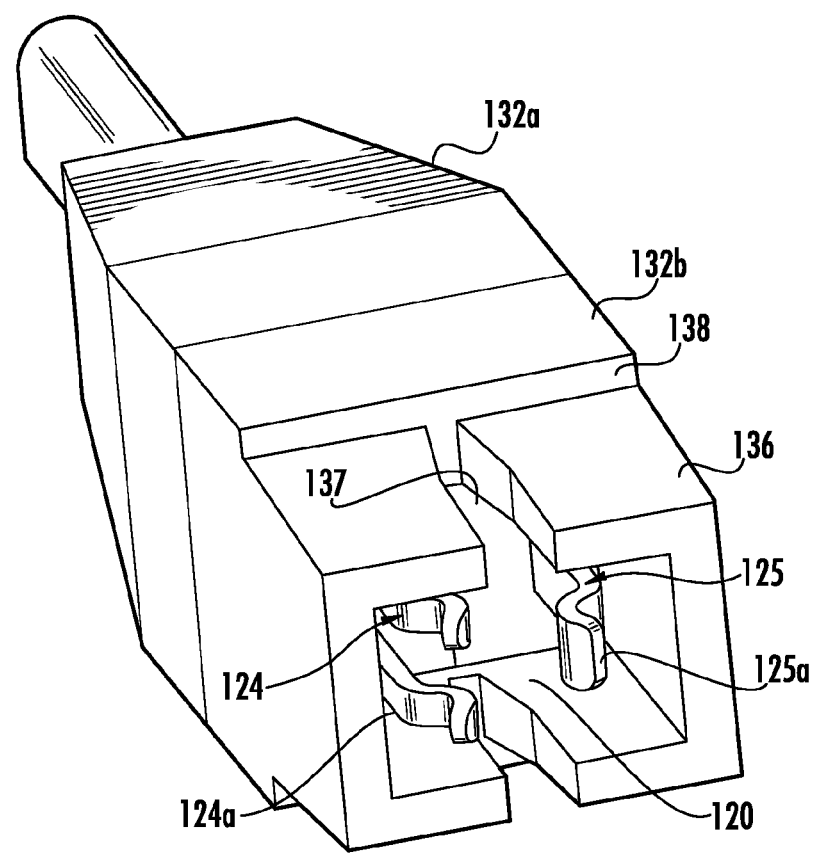
FIG. 10 is a perspective view of the mating face of the connector assembly plug portion of FIG.
Figure 11A:
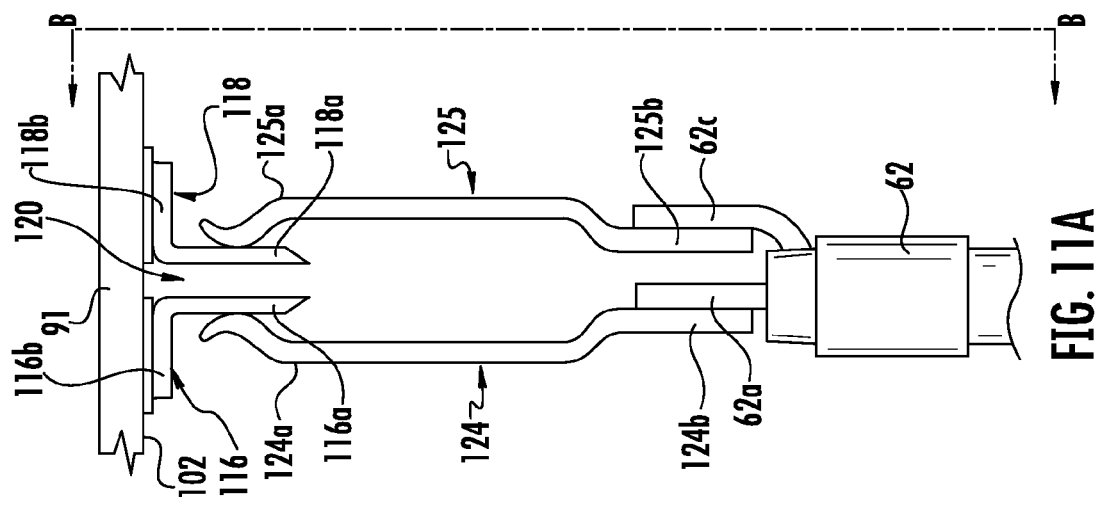
FIG. 11 is an enlarged sectional view of one of the connector assembly plug portions connected to a corresponding receptacle connector portion.
FIG. 11C is a perspective view of the terminals of the mated pair of FIG. 11.
Figure 11:
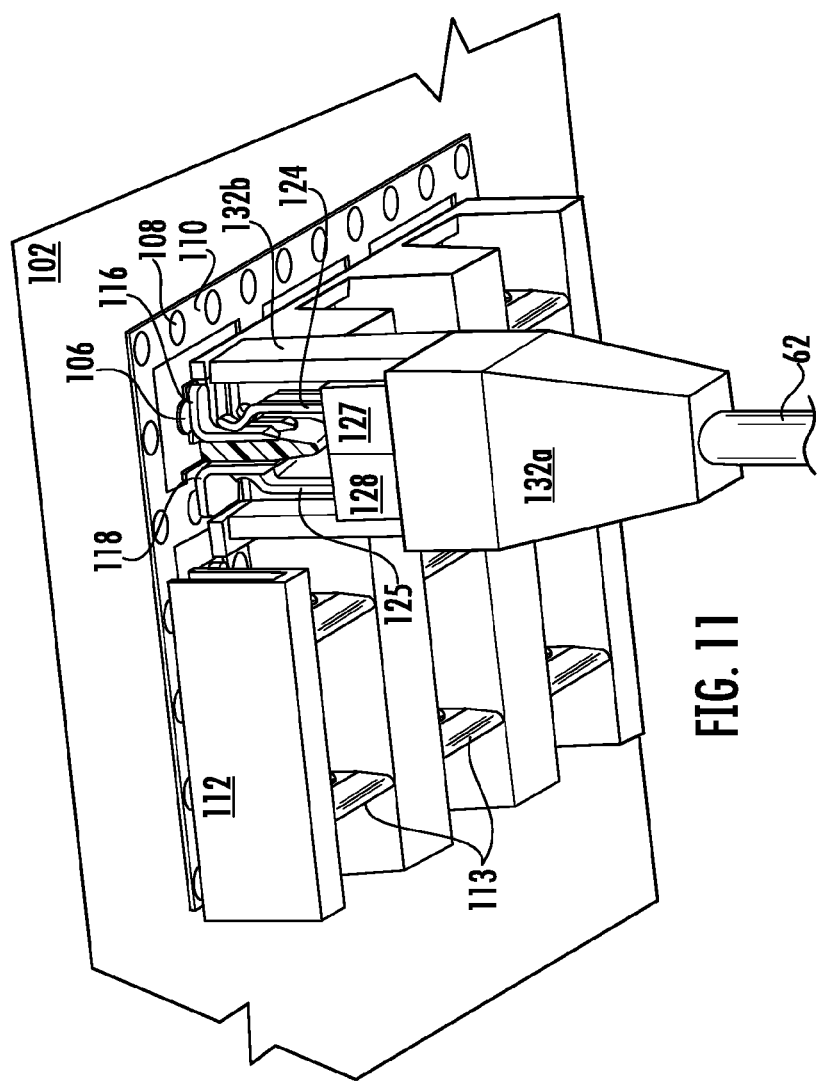
Figure 12:
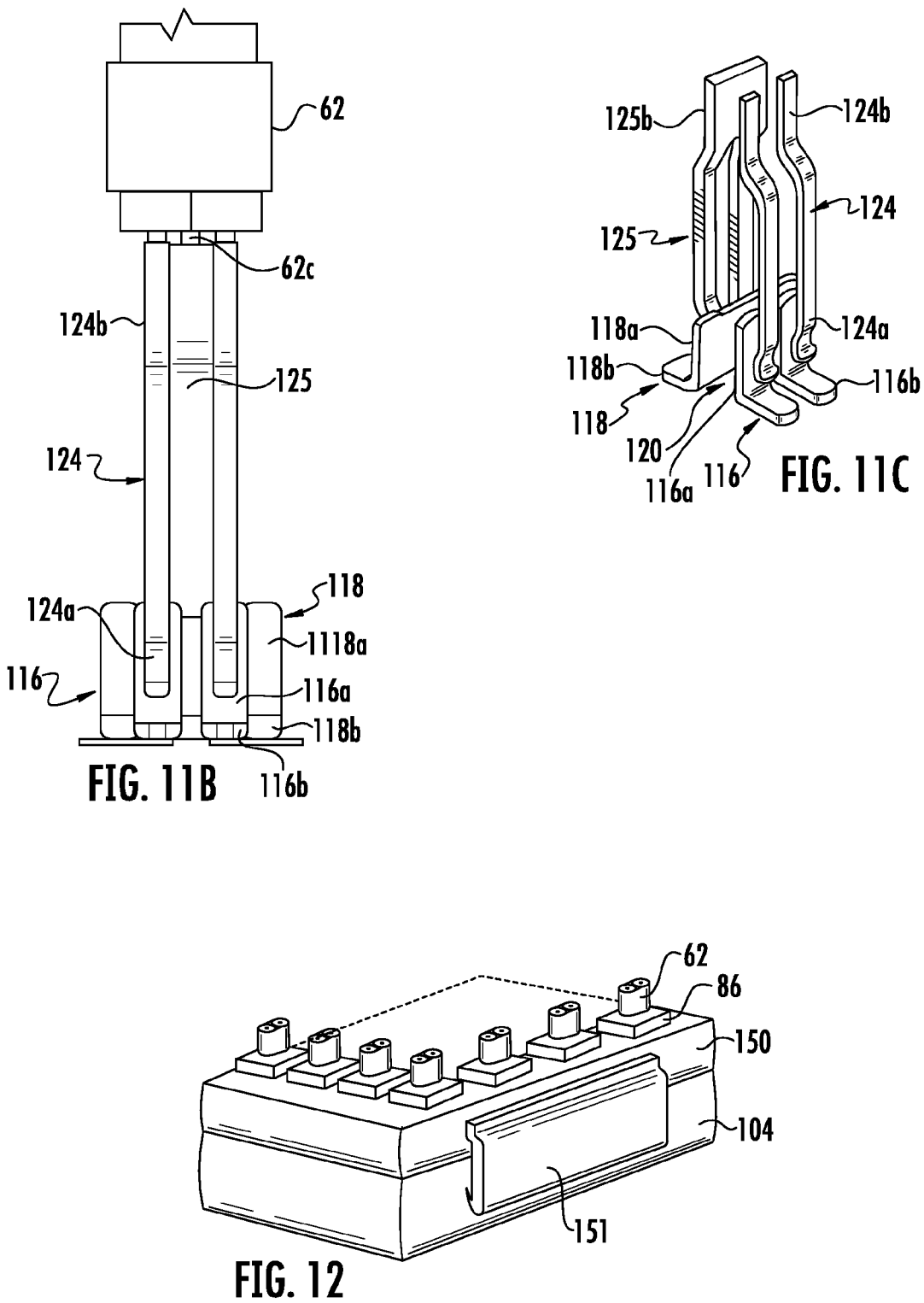
FIG. 12 is a perspective diagrammatic view of a housing that holds a series of connectors of FIG. 4; and, FIG. 13 is a diagram of a connector assembly of the present disclosure connected to a motherboard that supports a chip package.

FIGS. 8-10 illustrate the structure of the second connector 86 configured as a male plug. As illustrated in FIGS. 9 & 9A, the connector 86 includes a pair of signal terminals 124 which are spaced apart from each other. Preferably the spacing of the signal terminals 124 is the same spacing as the cable signal conductors 62a, which are terminated to tail portions 124b, 125b. The second connector 86 also includes a conductive ground terminal 125 which is terminated to the ground conductor 62c of the cable 62. The depicted ground terminal 125 has a width that is larger than the signal terminals 124 and the signal and ground terminals face each other to encourage broadside coupling between the signal terminals 124 and their associated ground terminal 125 throughout the length of the connector 86. The terminals 124, 125 are held in place by respective insulative fitting blocks 127, 128. The body portions of the terminals 124, 125 preferably include outward bends to define a final intervening space 130 located between the contact portions 124a, 125a at the mating end of the connector.

The second connector portion 86 has two hollow housing portions 132a, 132 b that fit together around a fitting blocks 127, 128. One portion 132a is in the nature of a hollow cap and fits over the termination area of the cable conductors 62a, 62c and engages top portions of the two fitting blocks. The other portion 132b is in the nature of a hollow skirt portion that extends as a wall 136 around the terminal contact portions 124a, 125a to enclose them as shown. The wall 136 is recessed in its outer profile to define a pair of shoulders 138 that engage opposing stop surfaces surrounding the receptacles 114 which cooperate to prevent over insertion of the plug connector in its corresponding receptacle 114.

The signal and ground terminal contact portions 124a, 125a extend in a cantilevered fashion from the fitting blocks 132a, 132b as shown. The contact portions 124a, 125a are separated by the intervening space that is larger than the intervening space between the receptacle connector terminal contact portions. With the depicted structure the contact portions 124a, 125a are able to flex outwardly and ride over the secondary wall 113 to engage the contact portions 116a, 118a in the receptacle 114, but exert a contact force on the opposing terminals. The connector housing bottom portion 132b further includes a slot 137 extending transversely in alignment with the intervening space 130. The slot 137 can be tapered and bifurcated in a manner complementary to the profile of the secondary wall 113 so that when the second connector 86 is mated to the third connector 104 the slot 137 is aligned with and positioned on the secondary wall 113, thus helping to provide a reliable engagement between the second connector 86 and the third connector 104.

Figure 13:
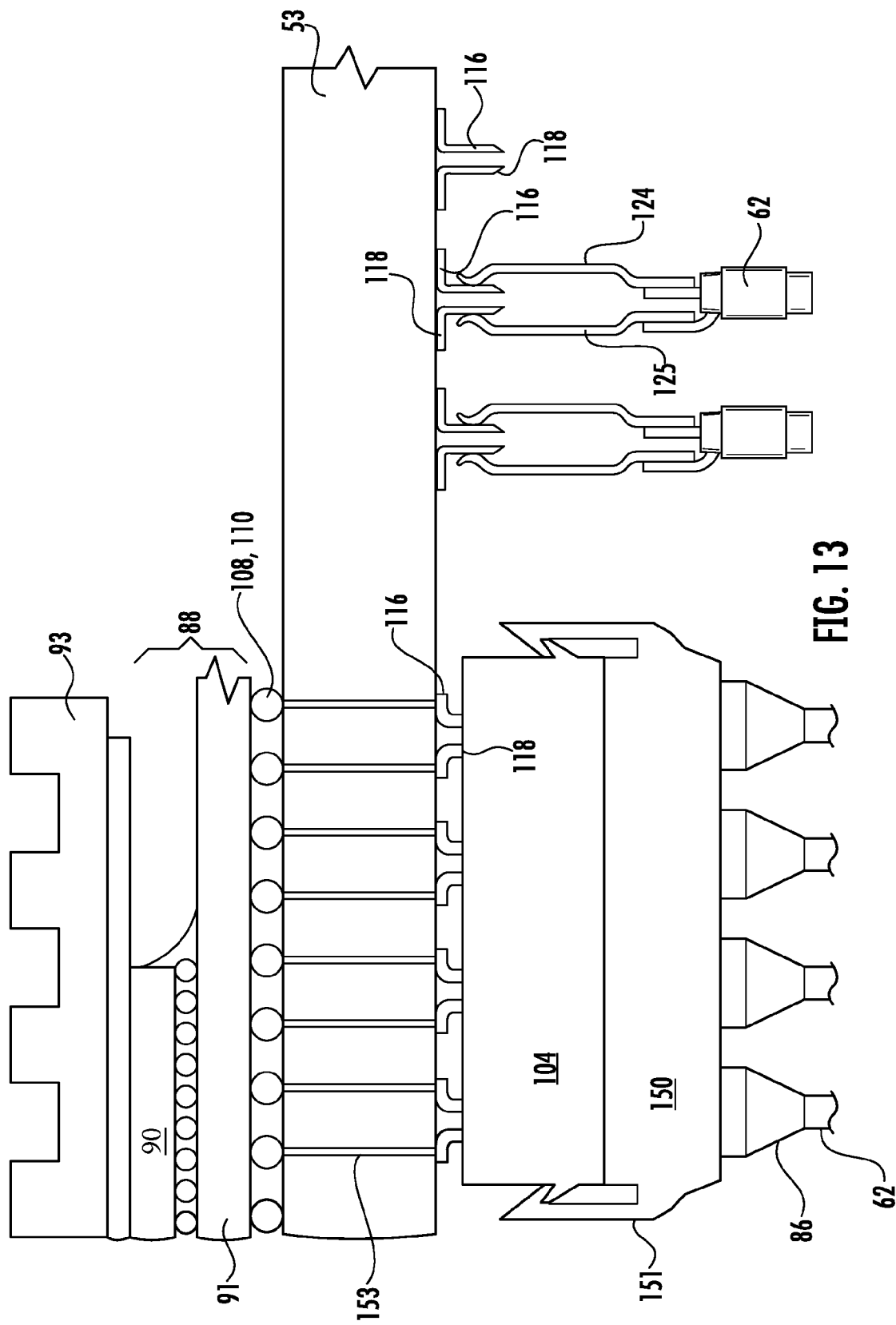

FIG. 13 is a sectional view of one manner of use of the connector assembly 100, where a heat sink 93 is attached to a chip package 88 (which can include a processor 90). The processor 90 is mounted to a substrate 91 that is mated to a motherboard 53. The depicted motherboard 53 uses solder balls to mate with the substrate 91 and a series of vias 153 extending vertically through the motherboard 53 to contacts on the underside of the motherboard 53. The third connector 104 is mounted to the motherboard 53 and the second connectors 86 are supported in a carrier 150 that is configured to align each of the second connectors 86 with a corresponding receptacle 114 and the carrier 150 is retained by way of clips 151. As can be appreciated, therefore, the third connectors 104 are mounted adjacent to and are in communication with the chip package 88. The vias 153 can be optimized for high-speed signal transmission without incurring impedance problems that are inherent with the use of circuit board traces and can help eliminate from 6 to 18 layers of circuit board. A simplified version of the connector assembly 100 is shown on the right side of FIG. 13.

As can be appreciated, the connectors assembly 100 may be made in a low profile, including the inline configuration shown and right angle second connectors, with heights above the mounting point being around 10 mm, including any bend in the associated cable. Such low heights permit the third connectors to be located on the substrate or a supporting motherboard within the perimeter of the opening 76 without unduly increasing the height of the routing assembly. Overall footprints of individual plug connectors of about 4 millimeters squared are contemplated. The triangular arrangement of the signal and ground conductors of each signal transmission channel can be maintained through the cable and the connector assembly. The use of individual second connectors 86 also permits effective heat dissipation through the use of air flow over the heat sink 93 and because of the structure, the heat sink 93 has more room and thus can be made larger.

The depicted configuration allows for significantly lower loss than would result if the system where using FR4 circuit board material to transmit the signals from the (less than half the insertion loss) at signal frequency rates of 12-25 GHz. The signal frequency range, as is known, can provide data rates of up to 100 Gbps (using PAM4 encoding).

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

We claim:

1. An integrated routing assembly, comprising:
a plurality of connector ports arranged on a front face;
a plurality of first connectors positioned in the plurality of connector ports, each of the first connectors including a plurality of first terminals;
a routing substrate extending from the connector ports to a first edge;
a plurality of cables positioned in the routing substrate, each of the cables each having a pair of conductors extending between a first end and a second end, each of the cables further including a drain wire, the first ends being connected to the plurality of first terminals, wherein a plurality of cables are connected to each of the first connectors;
a plurality of second connectors connected to the second ends of the plurality of cables and positioned adjacent the first edge, each of the plurality of second connectors including a first pair of signal terminals and a first ground terminal, the signals terminals connected to the pair of conductors and the ground terminal connected to the drain wire; and
at least one third connector in communication with and positioned adjacent a chip package, the at least one third connector having a second pair of signal terminals and a second ground terminal associated with each of the plurality of second connectors.

2. The integrated routing assembly of claim 1, wherein the plurality of cables are embedded in the routing substrate and the routing substrate is conductive.

3. The integrated routing assembly of claim 1, wherein the third connectors has a dielectric housing in a grid configuration that include main walls and secondary walls.

4. The integrated routing assembly of claim 3, wherein the second connectors each have a housing with a slot aligned with the secondary wall.

5. The integrated routing assembly of claim 3, wherein the secondary walls are shorter than the main walls.

6. The integrated routing assembly of claim 1, wherein the insertion loss is less than half the insertion loss of an FR4 circuit board at a signal frequency of between 12-25 GHz.

7. A system, comprising:
a metal housing with a front wall;
an array of connector ports arranged on the front wall;
a plurality of first connectors positioned in the plurality of connector ports, each of the first connectors including a plurality of first terminals;
a routing substrate extending from the connector ports to a first edge;
a plurality of cables positioned in the routing substrate, each of the cables each having a pair of conductors extending between a first end and a second end, each of the cables further including a drain wire, the first ends being connected to the plurality of first terminals, wherein a plurality of cables are connected to each of the first connectors;
a plurality of second connectors connected to the second ends of the plurality of cables and positioned adjacent the first edge, each of the plurality of second connectors including a first pair of signal terminals and a first ground terminal, the signals terminals connected to the pair of conductors and the ground terminal connected to the drain wire;
a motherboard positioned in the metal housing and supporting a chip package on a first side; and
a plurality of third connectors mounted on a second side of the motherboard and in communication with the chip package, the plurality of third connectors each having at least one second pair of signal terminals and at least one second ground terminal, wherein the plurality of second connectors are mated to the plurality of third connectors.

8. The system of claim 7, wherein the array is an N by M array with both N and M being equal or greater at least two.

9. The system of claim 7, wherein the at least one second pair of signal terminals and the at least one second ground terminal are connected to vias in the motherboard and the vias are in communication with a substrate in the chip package.

10. The system of claim 7, wherein the routing substrate has an opening that extends around the chip package.

11. The system of claim 10, wherein the plurality of cables extend into the opening from at least two directions.

12. The system of claim 11, wherein the plurality of cables extend into the opening from four directions.

* * * * *